United States Patent
Romero et al.

(10) Patent No.: US 11,578,997 B1
(45) Date of Patent: Feb. 14, 2023

(54) ANGLE SENSOR USING EDDY CURRENTS

(71) Applicant: Allegro MicroSystems, LLC, Manchester, NH (US)

(72) Inventors: Hernán D. Romero, Buenos Aires (AR); Octavio H. Alpago, Ciudad de Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/410,394

(22) Filed: Aug. 24, 2021

(51) Int. Cl.
*G01R 33/09* (2006.01)
*G01D 5/16* (2006.01)

(52) U.S. Cl.
CPC ............. *G01D 5/16* (2013.01); *G01R 33/098* (2013.01)

(58) Field of Classification Search
CPC ................................ G01D 5/16; G01R 33/098
See application file for complete search history.

(56) References Cited

U.S. PATENT DOCUMENTS

| | | | |
|---|---|---|---|
| 3,132,337 A | 5/1964 | Martin |
| 3,195,043 A | 7/1965 | Burig et al. |
| 3,281,628 A | 10/1966 | Bauer et al. |
| 3,607,528 A | 9/1971 | Gassaway |
| 3,611,138 A | 10/1971 | Winebrener |
| 3,661,061 A | 5/1972 | Tokarz |
| 3,728,786 A | 4/1973 | Lucas et al. |
| 4,048,670 A | 9/1977 | Eysermans |
| 4,180,753 A | 12/1979 | Cook, II |
| 4,188,605 A | 2/1980 | Stout |
| 4,204,317 A | 5/1980 | Winn |
| 4,236,832 A | 12/1980 | Komatsu et al. |
| 4,283,643 A | 8/1981 | Levin |

(Continued)

FOREIGN PATENT DOCUMENTS

| | | |
|---|---|---|
| CN | 683 469 A5 | 3/1994 |
| CN | 1 02323554 A | 1/2012 |

(Continued)

OTHER PUBLICATIONS

Response to Korean Office Action (w/machine English translation from Espacenet.com) dated Jun. 29, 2022 for Korean Application No. 10-2019-7035015; Response filed on Aug. 12, 2022; 40 pages.

(Continued)

*Primary Examiner* — Alvaro E Fortich
(74) *Attorney, Agent, or Firm* — Daly, Crowley, Mofford & Durkee, LLP

(57) ABSTRACT

A magnetic field angle sensor includes a coil configured to generate a magnetic field that induces an eddy current in a rotatable target, a first magnetic field sensing structure positioned proximate to the coil and configured to detect a reflected magnetic field generated by the eddy current induced in the target, a second magnetic field sensing structure positioned proximate to the coil and configured to detect the reflected magnetic field generated by the eddy current induced in the target, wherein the first and second magnetic field sensing structures are configured to detect quadrature components of the reflected magnetic field, and a processing module configured to process the reflected magnetic field detected by the first and second magnetic field sensing structures for determining an angular position of the target.

22 Claims, 10 Drawing Sheets

(56) References Cited

U.S. PATENT DOCUMENTS

| | | |
|---|---|---|
| 4,315,523 A | 2/1982 | Mahawili et al. |
| 4,438,347 A | 3/1984 | Gehring |
| 4,573,258 A | 3/1986 | Io et al. |
| 4,614,111 A | 9/1986 | Wolff |
| 4,649,796 A | 3/1987 | Schmidt |
| 4,670,715 A | 6/1987 | Fuzzell |
| 4,703,378 A | 10/1987 | Imakoshi et al. |
| 4,719,419 A | 1/1988 | Dawley |
| 4,733,455 A | 3/1988 | Nakamura et al. |
| 4,745,363 A | 5/1988 | Carr et al. |
| 4,746,859 A | 5/1988 | Malik |
| 4,752,733 A | 6/1988 | Petr et al. |
| 4,758,943 A | 7/1988 | Astrom et al. |
| 4,760,285 A | 7/1988 | Nelson |
| 4,764,767 A | 8/1988 | Ichikawa et al. |
| 4,769,344 A | 9/1988 | Sakai et al. |
| 4,772,929 A | 9/1988 | Manchester |
| 4,789,826 A | 12/1988 | Willett |
| 4,796,354 A | 1/1989 | Yokoyama et al. |
| 4,823,075 A | 4/1989 | Alley |
| 4,833,406 A | 5/1989 | Foster |
| 4,893,027 A | 1/1990 | Kammerer et al. |
| 4,908,685 A | 3/1990 | Shibasaki et al. |
| 4,910,861 A | 3/1990 | Dohogne |
| 4,935,698 A | 6/1990 | Kawaji et al. |
| 4,944,028 A | 7/1990 | Iijima et al. |
| 4,954,777 A | 9/1990 | Klopfer et al. |
| 4,970,411 A | 11/1990 | Haig et al. |
| 4,983,916 A | 1/1991 | Iijima et al. |
| 4,991,447 A | 2/1991 | Yahagi et al. |
| 5,012,322 A | 4/1991 | Guillotte et al. |
| 5,021,493 A | 6/1991 | Sandstrom |
| 5,028,868 A | 7/1991 | Murata et al. |
| 5,045,920 A | 9/1991 | Vig et al. |
| 5,078,944 A | 1/1992 | Yoshino |
| 5,084,289 A | 1/1992 | Shin et al. |
| 5,121,289 A | 6/1992 | Gagliardi |
| 5,137,677 A | 8/1992 | Murata |
| 5,139,973 A | 8/1992 | Nagy et al. |
| 5,167,896 A | 12/1992 | Hirota et al. |
| 5,185,919 A | 2/1993 | Hickey |
| 5,196,794 A | 3/1993 | Murata |
| 5,200,698 A | 4/1993 | Thibaud |
| 5,210,493 A | 5/1993 | Schroeder et al. |
| 5,216,405 A | 6/1993 | Schroeder et al. |
| 5,244,834 A | 9/1993 | Suzuki et al. |
| 5,247,202 A | 9/1993 | Popovic et al. |
| 5,247,278 A | 9/1993 | Pant et al. |
| 5,250,925 A | 10/1993 | Shinkle |
| 5,286,426 A | 2/1994 | Rano, Jr. et al. |
| 5,289,344 A | 2/1994 | Gagnon et al. |
| 5,315,245 A | 5/1994 | Schroeder et al. |
| 5,329,416 A | 7/1994 | Ushiyama et al. |
| 5,332,956 A | 7/1994 | Oh |
| 5,332,965 A | 7/1994 | Wolf et al. |
| 5,351,028 A | 9/1994 | Krahn |
| 5,399,968 A | 3/1995 | Sheppard et al. |
| 5,412,255 A | 5/1995 | Wallrafen |
| 5,414,355 A | 5/1995 | Davidson et al. |
| 5,424,558 A | 6/1995 | Borden et al. |
| 5,432,444 A | 7/1995 | Yasohama et al. |
| 5,434,105 A | 7/1995 | Liou |
| 5,453,727 A | 9/1995 | Shibasaki et al. |
| 5,469,058 A | 11/1995 | Dunnam |
| 5,479,695 A | 1/1996 | Grader et al. |
| 5,486,759 A | 1/1996 | Seiler et al. |
| 5,488,294 A | 1/1996 | Liddell et al. |
| 5,491,633 A | 2/1996 | Henry et al. |
| 5,497,081 A | 3/1996 | Wolf et al. |
| 5,500,589 A | 3/1996 | Sumcad |
| 5,500,994 A | 3/1996 | Itaya |
| 5,508,611 A | 4/1996 | Schroeder et al. |
| 5,514,953 A | 5/1996 | Schultz et al. |
| 5,521,501 A | 5/1996 | Dettmann et al. |
| 5,545,983 A | 8/1996 | Okeya et al. |
| 5,551,146 A | 9/1996 | Kawabata et al. |
| 5,581,170 A | 12/1996 | Mammano et al. |
| 5,581,179 A | 12/1996 | Engel et al. |
| 5,596,272 A | 1/1997 | Busch |
| 5,621,319 A | 4/1997 | Bilotti et al. |
| 5,627,315 A | 5/1997 | Figi et al. |
| 5,631,557 A | 5/1997 | Davidson |
| 5,640,090 A | 6/1997 | Furuya et al. |
| 5,691,637 A | 11/1997 | Oswald et al. |
| 5,696,790 A | 12/1997 | Graham et al. |
| 5,712,562 A | 1/1998 | Berg |
| 5,714,102 A | 2/1998 | Highum et al. |
| 5,719,496 A | 2/1998 | Wolf |
| 5,729,128 A | 3/1998 | Bunyer et al. |
| 5,757,181 A | 5/1998 | Wolf et al. |
| 5,781,005 A | 7/1998 | Vig et al. |
| 5,789,658 A | 8/1998 | Henn et al. |
| 5,789,915 A | 8/1998 | Ingraham |
| 5,796,249 A | 8/1998 | Andraet et al. |
| 5,798,462 A | 8/1998 | Briefer et al. |
| 5,818,222 A | 10/1998 | Ramsden |
| 5,818,223 A | 10/1998 | Wolf |
| 5,839,185 A | 11/1998 | Smith et al. |
| 5,841,276 A | 11/1998 | Makino et al. |
| 5,859,387 A | 1/1999 | Gagnon |
| 5,883,567 A | 3/1999 | Mullins, Jr. |
| 5,886,070 A | 3/1999 | Honkura et al. |
| 5,896,030 A | 4/1999 | Hasken |
| 5,912,556 A | 6/1999 | Frazee et al. |
| 5,963,028 A | 10/1999 | Engel et al. |
| 6,011,770 A | 1/2000 | Tan |
| 6,016,055 A | 1/2000 | Jager et al. |
| 6,032,536 A | 3/2000 | Peeters et al. |
| 6,043,644 A | 3/2000 | De Coulon et al. |
| 6,043,646 A | 3/2000 | Jansseune |
| 6,064,198 A | 5/2000 | Wolf et al. |
| 6,111,403 A | 8/2000 | Yokotani et al. |
| 6,136,250 A | 10/2000 | Brown |
| 6,169,396 B1 | 1/2001 | Yokotani et al. |
| 6,175,232 B1 | 1/2001 | De Coulon et al. |
| 6,175,233 B1 | 1/2001 | McCurley et al. |
| 6,180,041 B1 | 1/2001 | Takizawa |
| 6,184,679 B1 | 2/2001 | Popovic et al. |
| 6,198,373 B1 | 3/2001 | Ogawa et al. |
| 6,242,604 B1 | 6/2001 | Hudlicky et al. |
| 6,242,904 B1 | 6/2001 | Shirai et al. |
| 6,242,905 B1 | 6/2001 | Draxelmayr |
| 6,265,865 B1 | 7/2001 | Engel et al. |
| 6,278,269 B1 | 8/2001 | Vig et al. |
| 6,297,627 B1 | 10/2001 | Towne et al. |
| 6,339,322 B1 | 1/2002 | Loreck et al. |
| 6,351,506 B1 | 2/2002 | Lewicki |
| 6,356,068 B1 | 3/2002 | Steiner et al. |
| 6,366,079 B1 | 4/2002 | Uenoyama |
| 6,392,478 B1 | 5/2002 | Mulder et al. |
| 6,429,640 B1 | 8/2002 | Daughton et al. |
| 6,436,748 B1 | 8/2002 | Forbes et al. |
| 6,437,558 B2 | 8/2002 | Li et al. |
| 6,452,381 B1 | 9/2002 | Nakatani et al. |
| 6,462,536 B1 | 10/2002 | Mednikov et al. |
| 6,492,804 B2 | 12/2002 | Tsuge et al. |
| 6,501,270 B1 | 12/2002 | Opie |
| 6,504,363 B1 | 1/2003 | Dogaru et al. |
| 6,525,531 B2 | 2/2003 | Forrest et al. |
| 6,528,992 B2 | 3/2003 | Shinjo et al. |
| 6,542,847 B1 | 4/2003 | Lohberg et al. |
| 6,545,332 B2 | 4/2003 | Huang |
| 6,545,457 B2 | 4/2003 | Goto et al. |
| 6,545,462 B2 | 4/2003 | Schott et al. |
| 6,566,862 B1 | 5/2003 | Goto et al. |
| 6,566,872 B1 | 5/2003 | Sugitani |
| 6,640,451 B1 | 11/2003 | Vinarcik |
| 6,642,711 B2 | 11/2003 | Kawate et al. |
| 6,653,968 B1 | 11/2003 | Schneider |
| 6,674,679 B1 | 1/2004 | Perner et al. |
| 6,687,644 B1 | 2/2004 | Zinke et al. |
| 6,692,676 B1 | 2/2004 | Vig et al. |
| 6,707,298 B2 | 3/2004 | Suzuki et al. |
| 6,759,843 B2 | 7/2004 | Furlong |

(56) References Cited

U.S. PATENT DOCUMENTS

| | | |
|---|---|---|
| 6,770,163 B1 | 8/2004 | Kuah et al. |
| 6,781,233 B2 | 8/2004 | Zverev et al. |
| 6,781,359 B2 | 8/2004 | Stauth et al. |
| 6,798,193 B2 | 9/2004 | Zimmerman et al. |
| 6,815,944 B2 | 11/2004 | Vig et al. |
| 6,822,443 B1 | 11/2004 | Dogaru |
| 6,853,178 B2 | 2/2005 | Hayat-Dawoodi |
| 6,896,407 B2 | 5/2005 | Nomiyama et al. |
| 6,902,951 B2 | 6/2005 | Goller et al. |
| 6,917,321 B1 | 7/2005 | Haurie et al. |
| 6,956,366 B2 | 10/2005 | Butzmann |
| 6,989,921 B2 | 1/2006 | Bernstein et al. |
| 7,009,384 B2 | 3/2006 | Heremans et al. |
| 7,023,205 B1 | 4/2006 | Krupp |
| 7,026,808 B2 | 4/2006 | Vig et al. |
| 7,031,170 B2 | 4/2006 | Daeche et al. |
| 7,038,448 B2 | 5/2006 | Schott et al. |
| 7,049,924 B2 | 5/2006 | Hayashi et al. |
| 7,112,955 B2 | 9/2006 | Buchhold |
| 7,112,957 B2 | 9/2006 | Bicking |
| 7,126,327 B1 | 10/2006 | Busch |
| 7,132,825 B2 | 11/2006 | Martin |
| 7,190,784 B2 | 3/2007 | Li |
| 7,193,412 B2 | 3/2007 | Freeman |
| 7,199,579 B2 | 4/2007 | Scheller et al. |
| 7,259,545 B2 | 8/2007 | Stauth et al. |
| 7,265,531 B2 | 9/2007 | Stauth et al. |
| 7,269,992 B2 | 9/2007 | Lamb et al. |
| 7,285,952 B1 | 10/2007 | Hatanaka et al. |
| 7,292,095 B2 | 11/2007 | Burt et al. |
| 7,295,000 B2 | 11/2007 | Werth |
| 7,319,319 B2 | 1/2008 | Jones et al. |
| 7,323,780 B2 | 1/2008 | Daubenspeck et al. |
| 7,323,870 B2 | 1/2008 | Tatschl et al. |
| 7,325,175 B2 | 1/2008 | Momtaz |
| 7,345,468 B2 | 3/2008 | Okada et al. |
| 7,355,388 B2 | 4/2008 | Ishio |
| 7,361,531 B2 | 4/2008 | Sharma et al. |
| 7,362,094 B2 | 4/2008 | Voisine et al. |
| 7,365,530 B2 | 4/2008 | Bailey et al. |
| 7,385,394 B2 | 6/2008 | Auburger et al. |
| 7,425,821 B2 | 9/2008 | Monreal et al. |
| 7,474,093 B2 | 1/2009 | Ausserlechner |
| 7,476,953 B2 | 1/2009 | Taylor et al. |
| 7,518,354 B2 | 4/2009 | Stauth et al. |
| 7,592,801 B2 | 9/2009 | Bailey et al. |
| 7,598,601 B2 | 10/2009 | Taylor et al. |
| 7,605,647 B1 | 10/2009 | Romero et al. |
| 7,635,993 B2 | 12/2009 | Boeve |
| 7,694,200 B2 | 4/2010 | Forrest et al. |
| 7,701,208 B2 | 4/2010 | Nishikawa |
| 7,705,586 B2 | 4/2010 | Van Zon et al. |
| 7,729,675 B2 | 6/2010 | Krone |
| 7,746,056 B2 | 6/2010 | Stauth et al. |
| 7,746,065 B2 | 6/2010 | Pastre et al. |
| 7,764,118 B2 | 7/2010 | Kusuda et al. |
| 7,768,083 B2 | 8/2010 | Doogue et al. |
| 7,769,110 B2 | 8/2010 | Momtaz |
| 7,800,389 B2 | 9/2010 | Friedrich et al. |
| 7,808,074 B2 | 10/2010 | Knittl |
| 7,816,772 B2 | 10/2010 | Engel et al. |
| 7,816,905 B2 | 10/2010 | Doogue et al. |
| 7,839,141 B2 | 11/2010 | Werth et al. |
| 7,923,996 B2 | 4/2011 | Doogue et al. |
| 7,936,144 B2 | 5/2011 | Vig et al. |
| 7,956,604 B2 | 6/2011 | Ausserlechner |
| 7,961,823 B2 | 6/2011 | Kolze et al. |
| 7,982,454 B2 | 7/2011 | Fernandez et al. |
| 7,990,209 B2 | 8/2011 | Romero |
| 8,030,918 B2 | 10/2011 | Doogue et al. |
| 8,058,870 B2 | 11/2011 | Sterling |
| 8,063,631 B2 | 11/2011 | Fermon et al. |
| 8,063,634 B2 | 11/2011 | Sauber et al. |
| 8,080,993 B2 | 12/2011 | Theuss et al. |
| 8,106,649 B2 | 1/2012 | Kaita et al. |
| 8,106,654 B2 | 1/2012 | Theuss et al. |
| 8,128,549 B2 | 3/2012 | Testani et al. |
| 8,134,358 B2 | 3/2012 | Charlier et al. |
| 8,143,169 B2 | 3/2012 | Engel et al. |
| 8,253,210 B2 | 8/2012 | Theuss et al. |
| 8,274,279 B2 | 9/2012 | Gies |
| 8,299,783 B2 | 10/2012 | Fernandez et al. |
| 8,362,579 B2 | 1/2013 | Theuss et al. |
| 8,447,556 B2 | 5/2013 | Friedrich et al. |
| 8,461,677 B2 | 6/2013 | Ararao et al. |
| 8,486,755 B2 | 7/2013 | Ararao et al. |
| 8,542,010 B2 | 9/2013 | Cesaretti et al. |
| 8,559,139 B2 | 10/2013 | Theuss |
| 8,577,634 B2 | 11/2013 | Donovan et al. |
| 8,610,430 B2 | 12/2013 | Werth et al. |
| 8,624,588 B2 | 1/2014 | Vig et al. |
| 8,629,520 B2 | 1/2014 | Doogue et al. |
| 8,629,539 B2 | 1/2014 | Milano et al. |
| 8,680,846 B2 | 3/2014 | Cesaretti et al. |
| 8,680,848 B2 | 3/2014 | Foletto et al. |
| 8,754,640 B2 | 6/2014 | Vig et al. |
| 8,773,124 B2 | 7/2014 | Ausserlechner |
| 9,081,041 B2 | 7/2015 | Friedrich et al. |
| 9,116,018 B2 | 8/2015 | Frachon |
| 9,164,156 B2 | 10/2015 | Elian et al. |
| 9,201,122 B2 | 12/2015 | Cesaeretti et al. |
| 9,201,123 B2 | 12/2015 | Elian et al. |
| 9,228,860 B2 | 1/2016 | Sharma et al. |
| 9,354,284 B2 | 5/2016 | Latham |
| 9,411,025 B2 | 8/2016 | David et al. |
| 9,664,494 B2 | 5/2017 | Fernandez et al. |
| 9,812,637 B2 | 11/2017 | Fermon et al. |
| 9,841,485 B2 | 12/2017 | Petrie et al. |
| 10,324,141 B2 | 6/2019 | Latham et al. |
| 10,495,699 B2 | 12/2019 | Burdette et al. |
| 10,509,058 B2 | 12/2019 | Cadugan et al. |
| 10,578,684 B2 | 3/2020 | Cadugan et al. |
| 10,641,842 B2 | 5/2020 | Latham et al. |
| 10,734,443 B2 | 8/2020 | Lassalle-Balier et al. |
| 10,753,989 B2 | 8/2020 | Campiglio et al. |
| 10,837,943 B2 | 11/2020 | Romero |
| 10,996,289 B2 | 5/2021 | Latham et al. |
| 11,085,952 B2 | 8/2021 | Cadugan et al. |
| 11,112,230 B2 | 9/2021 | Latham et al. |
| 2001/0002791 A1 | 6/2001 | Tsuge et al. |
| 2001/0009367 A1 | 7/2001 | Seitzer et al. |
| 2001/0026153 A1 | 10/2001 | Nakamura et al. |
| 2002/0008513 A1 | 1/2002 | Hiligsmann et al. |
| 2002/0027488 A1 | 3/2002 | Hayat-Dawoodi et al. |
| 2002/0084923 A1 | 7/2002 | Li |
| 2002/0097639 A1 | 7/2002 | Ishizaki et al. |
| 2003/0001563 A1 | 1/2003 | Turner |
| 2003/0038675 A1 | 2/2003 | Gailus et al. |
| 2003/0057983 A1 | 3/2003 | Kim et al. |
| 2003/0062891 A1 | 4/2003 | Slates |
| 2003/0102909 A1 | 6/2003 | Motz |
| 2003/0222642 A1 | 12/2003 | Butzmann |
| 2003/0227286 A1 | 12/2003 | Dunisch et al. |
| 2004/0032251 A1 | 2/2004 | Zimmerman et al. |
| 2004/0046248 A1 | 3/2004 | Waelti et al. |
| 2004/0062362 A1 | 4/2004 | Matsuya |
| 2004/0080314 A1 | 4/2004 | Tsujii et al. |
| 2004/0135220 A1 | 7/2004 | Goto |
| 2004/0174164 A1 | 9/2004 | Ao |
| 2004/0184196 A1 | 9/2004 | Jayasekara |
| 2004/0189285 A1 | 9/2004 | Uenoyama |
| 2004/0196045 A1 | 10/2004 | Larsen |
| 2004/0263014 A1 | 12/2004 | Miya |
| 2005/0017709 A1 | 1/2005 | Stolfus et al. |
| 2005/0120782 A1 | 6/2005 | Kishibata et al. |
| 2005/0122095 A1 | 6/2005 | Dooley |
| 2005/0122099 A1 | 6/2005 | Imamoto et al. |
| 2005/0140355 A1 | 6/2005 | Yamada et al. |
| 2005/0167790 A1 | 8/2005 | Khor et al. |
| 2005/0179429 A1 | 8/2005 | Lohberg |
| 2005/0225318 A1 | 10/2005 | Bailey et al. |
| 2005/0225320 A1 | 10/2005 | Lee |
| 2005/0280411 A1 | 12/2005 | Bicking |
| 2006/0033487 A1 | 2/2006 | Nagano et al. |

(56) References Cited

U.S. PATENT DOCUMENTS

| | | |
|---|---|---|
| 2006/0038559 A1 | 2/2006 | Lamb et al. |
| 2006/0038561 A1 | 2/2006 | Honkura et al. |
| 2006/0068237 A1 | 3/2006 | Murphy et al. |
| 2006/0097717 A1 | 5/2006 | Tokuhara et al. |
| 2006/0104558 A1 | 5/2006 | Gallion et al. |
| 2006/0125473 A1 | 6/2006 | Frachon et al. |
| 2006/0181263 A1 | 8/2006 | Doogue et al. |
| 2006/0202692 A1 | 9/2006 | Tatschl et al. |
| 2006/0261801 A1 | 11/2006 | Busch |
| 2007/0001666 A1 | 1/2007 | Lee |
| 2007/0110199 A1 | 5/2007 | Momtaz et al. |
| 2007/0170533 A1 | 7/2007 | Doogue et al. |
| 2007/0247141 A1 | 10/2007 | Pastre et al. |
| 2007/0285089 A1 | 12/2007 | Ibuki et al. |
| 2008/0013298 A1 | 1/2008 | Sharma et al. |
| 2008/0137784 A1 | 6/2008 | Krone |
| 2008/0211492 A1 | 9/2008 | Tsukada et al. |
| 2008/0237818 A1 | 10/2008 | Engel et al. |
| 2008/0238410 A1 | 10/2008 | Charlier et al. |
| 2008/0258722 A1 | 10/2008 | Zon et al. |
| 2008/0270067 A1 | 10/2008 | Eriksen et al. |
| 2009/0001964 A1 | 1/2009 | Strzalkowski |
| 2009/0009163 A1 | 1/2009 | Yamada |
| 2009/0058404 A1 | 3/2009 | Kurumado |
| 2009/0085706 A1 | 4/2009 | Baarman et al. |
| 2009/0102467 A1 | 4/2009 | Snell et al. |
| 2009/0137398 A1 | 5/2009 | Bozovic et al. |
| 2009/0140724 A1 | 6/2009 | Kentsch |
| 2009/0140725 A1 | 6/2009 | Ausserlechner |
| 2009/0146647 A1 | 6/2009 | Ausserlechner |
| 2009/0152696 A1 | 6/2009 | Dimasacat et al. |
| 2009/0167298 A1 | 7/2009 | Kreutzbruck et al. |
| 2009/0167301 A1 | 7/2009 | Ausserlechner |
| 2009/0168286 A1 | 7/2009 | Berkley et al. |
| 2009/0206831 A1 | 8/2009 | Fermon et al. |
| 2009/0212765 A1 | 8/2009 | Doogue et al. |
| 2009/0243601 A1 | 10/2009 | Feldtkeller |
| 2009/0251134 A1 | 10/2009 | Uenoyama |
| 2009/0256552 A1 | 10/2009 | Guo et al. |
| 2009/0315543 A1 | 12/2009 | Guo et al. |
| 2009/0315548 A1 | 12/2009 | Bonin |
| 2010/0033175 A1 | 2/2010 | Boeve et al. |
| 2010/0052667 A1 | 3/2010 | Kohama et al. |
| 2010/0053789 A1 | 3/2010 | Duric et al. |
| 2010/0072988 A1 | 3/2010 | Hammerschmidt et al. |
| 2010/0141249 A1 | 6/2010 | Ararao et al. |
| 2010/0188078 A1 | 7/2010 | Foletto et al. |
| 2010/0201356 A1 | 8/2010 | Koller et al. |
| 2010/0207620 A1 | 8/2010 | Gies |
| 2010/0264909 A1 | 10/2010 | Scheller et al. |
| 2010/0276769 A1 | 11/2010 | Theuss et al. |
| 2010/0295140 A1 | 11/2010 | Theuss et al. |
| 2010/0330708 A1 | 12/2010 | Engel et al. |
| 2011/0004278 A1 | 1/2011 | Aghassian et al. |
| 2011/0018533 A1 | 1/2011 | Cesaretti et al. |
| 2011/0031960 A1 | 2/2011 | Hohe et al. |
| 2011/0050220 A1 | 3/2011 | Bootle et al. |
| 2011/0087456 A1* | 4/2011 | Satou .............. B62D 5/049 324/207.25 |
| 2011/0127998 A1 | 6/2011 | Elian et al. |
| 2011/0187354 A1 | 8/2011 | Zieren et al. |
| 2011/0224537 A1 | 9/2011 | Brunner |
| 2011/0248711 A1 | 10/2011 | Ausserlechner |
| 2011/0267040 A1 | 11/2011 | Frachon |
| 2011/0285384 A1 | 11/2011 | Nomura |
| 2012/0019236 A1 | 1/2012 | Tiernan et al. |
| 2012/0019239 A1 | 1/2012 | Decitre |
| 2012/0062215 A1 | 3/2012 | Ide et al. |
| 2012/0293167 A1 | 11/2012 | Kitanaka et al. |
| 2012/0303305 A1 | 11/2012 | Bergqvist et al. |
| 2013/0113474 A1 | 5/2013 | Elian |
| 2013/0147470 A1 | 6/2013 | Mulholland et al. |
| 2013/0207648 A1 | 8/2013 | Zibold et al. |
| 2013/0214777 A1 | 8/2013 | Itoi |
| 2013/0241543 A1 | 9/2013 | Stenson et al. |
| 2013/0249029 A1 | 9/2013 | Vig et al. |
| 2013/0249544 A1 | 9/2013 | Vig et al. |
| 2013/0278246 A1 | 10/2013 | Stegerer et al. |
| 2013/0300401 A1 | 11/2013 | Krapf et al. |
| 2013/0300402 A1 | 11/2013 | Liu et al. |
| 2013/0300406 A1 | 11/2013 | Pepka et al. |
| 2014/0184214 A1 | 7/2014 | Schaffer et al. |
| 2014/0327435 A1 | 11/2014 | Rohrer |
| 2014/0333295 A1 | 11/2014 | Fernandez et al. |
| 2015/0022187 A1 | 1/2015 | Taylor et al. |
| 2015/0022193 A1 | 1/2015 | Burdette et al. |
| 2015/0022197 A1 | 1/2015 | David et al. |
| 2015/0022198 A1 | 1/2015 | David et al. |
| 2015/0211895 A1 | 7/2015 | Reitsma et al. |
| 2015/0236869 A1 | 8/2015 | Vreeland et al. |
| 2015/0346290 A1 | 12/2015 | Holm et al. |
| 2015/0362336 A1 | 12/2015 | Cook |
| 2016/0061863 A1 | 3/2016 | Zhang |
| 2016/0069662 A1 | 3/2016 | Mullenix et al. |
| 2016/0123771 A1 | 5/2016 | David et al. |
| 2016/0123774 A1 | 5/2016 | Foletto et al. |
| 2016/0139229 A1 | 5/2016 | Petrie et al. |
| 2016/0169983 A1 | 6/2016 | Chang et al. |
| 2016/0339948 A1 | 11/2016 | Nakamura et al. |
| 2017/0131366 A1 | 5/2017 | Motz et al. |
| 2017/0234702 A1* | 8/2017 | Tima .............. G01R 33/072 324/207.25 |
| 2017/0248445 A1 | 8/2017 | Ausserlechner |
| 2018/0011150 A1 | 1/2018 | Pepka et al. |
| 2018/0340986 A1* | 11/2018 | Latham .............. G01R 33/09 |
| 2018/0340990 A1 | 11/2018 | Latham et al. |
| 2018/0356474 A1 | 12/2018 | Hammerschmidt et al. |
| 2019/0383646 A1* | 12/2019 | Lassalle-Balier ........ G01D 5/16 |
| 2020/0249286 A1 | 8/2020 | David et al. |
| 2021/0349163 A1 | 11/2021 | Romero |
| 2022/0357144 A1 | 11/2022 | Tombez |

FOREIGN PATENT DOCUMENTS

| | | |
|---|---|---|
| CN | 102331587 A | 1/2012 |
| CN | 102483443 A | 5/2012 |
| CN | 102713654 A | 10/2012 |
| CN | 102954808 A | 3/2013 |
| CN | 105378500 A | 3/2016 |
| DE | 25 18 054 | 11/1976 |
| DE | 40 31 560 A | 4/1992 |
| DE | 195 39 458 | 4/1997 |
| DE | 196 34 715 | 3/1998 |
| DE | 196 50 935 | 6/1998 |
| DE | 198 38 433 | 3/1999 |
| DE | 198 51 839 | 11/1999 |
| DE | 1999 61 504 | 6/2001 |
| DE | 102 10 184 | 9/2003 |
| DE | 103 14 602 | 10/2004 |
| DE | 10 2006 037 226 | 2/2008 |
| DE | 10 2007 018 238 | 10/2008 |
| DE | 10 2007 041 230 B3 | 4/2009 |
| DE | 10 2010 016 584 | 11/2010 |
| DE | 10 2011 102483 | 11/2012 |
| EP | 0146091 | 6/1985 |
| EP | 0 289 414 A2 | 11/1988 |
| EP | 0 289 414 A3 | 11/1988 |
| EP | 0 357 013 A2 | 3/1990 |
| EP | 0 357 013 A3 | 3/1990 |
| EP | 0 361 456 A2 | 4/1990 |
| EP | 0629834 | 12/1994 |
| EP | 0 680 103 | 11/1995 |
| EP | 0 898 180 A2 | 2/1999 |
| EP | 0 944 888 B1 | 10/2001 |
| EP | 1306687 A2 | 5/2003 |
| EP | 1 443 332 | 8/2004 |
| EP | 1 580 560 | 9/2005 |
| EP | 1 637 898 | 3/2006 |
| EP | 1 662 353 | 5/2006 |
| EP | 1 679 524 | 7/2006 |
| EP | 1 850 143 | 10/2007 |
| EP | 2 063 229 | 5/2009 |
| EP | 1 797496 | 7/2009 |
| EP | 2402719 | 1/2012 |

(56) References Cited

FOREIGN PATENT DOCUMENTS

| | | |
|---|---|---|
| EP | 2 685 273 | 1/2014 |
| EP | 3 139 190 | 8/2017 |
| FR | 2 748 105 | 10/1997 |
| FR | 2 909 756 | 6/2008 |
| GB | 2135060 A | 8/1984 |
| GB | 2276727 | 10/1994 |
| GB | 2 481 482 | 12/2011 |
| JP | S 5771504 A | 5/1982 |
| JP | S 60-152950 | 8/1985 |
| JP | S 60182503 A | 9/1985 |
| JP | S 61-48777 | 3/1986 |
| JP | S 6367583 A | 3/1988 |
| JP | 363 084176 A | 4/1988 |
| JP | S 63-263782 | 10/1988 |
| JP | S 63-300911 | 12/1988 |
| JP | H 02-116753 | 5/1990 |
| JP | H 03-29817 | 2/1991 |
| JP | H 0335182 A | 2/1991 |
| JP | H 04-095817 | 3/1992 |
| JP | H 06-273437 | 9/1994 |
| JP | H 07/128295 A | 5/1995 |
| JP | H 08-097486 | 4/1996 |
| JP | H 08-511348 A | 11/1996 |
| JP | H 09-1 66612 | 6/1997 |
| JP | H 09/292471 A | 11/1997 |
| JP | H 10-318784 | 12/1998 |
| JP | H 10-332725 | 12/1998 |
| JP | H 11-064363 | 3/1999 |
| JP | H 11-074142 | 3/1999 |
| JP | 2000-183241 | 6/2000 |
| JP | 2001-043475 A | 2/2001 |
| JP | 2001-141738 | 5/2001 |
| JP | 2001-165702 A | 6/2001 |
| JP | 2001-1659951 | 6/2001 |
| JP | 2002-117500 A | 4/2002 |
| JP | 2002-149013 A | 5/2002 |
| JP | 2002-357920 A | 12/2002 |
| JP | 2003-177171 | 6/2003 |
| JP | 2003-202365 A | 7/2003 |
| JP | 2003/240759 A | 8/2003 |
| JP | 2003-287439 A | 10/2003 |
| JP | 2004-055932 | 2/2004 |
| JP | 2004-093381 | 3/2004 |
| JP | 2004-152688 | 5/2004 |
| JP | 2004-356338 A | 12/2004 |
| JP | 2004-357858 A | 12/2004 |
| JP | 2005-517928 | 6/2005 |
| JP | 2005-337866 | 12/2005 |
| JP | 2005-345302 | 12/2005 |
| JP | 2006-003096 A | 1/2006 |
| JP | 2006-003116 A | 1/2006 |
| JP | 2006-275764 | 10/2006 |
| JP | 2006-284466 A | 10/2006 |
| JP | 2007-012582 A | 1/2007 |
| JP | 2007-218799 | 8/2007 |
| JP | 2007-240202 | 9/2007 |
| JP | 2008-180550 | 8/2008 |
| JP | 2008-264569 | 11/2008 |
| JP | 2008-286667 A | 11/2008 |
| JP | 2009-002911 A | 1/2009 |
| JP | 2009-222524 | 10/2009 |
| JP | 2009-250725 A | 10/2009 |
| JP | 2009-250931 A | 10/2009 |
| JP | 2010-537207 A | 12/2010 |
| JP | 2011/086479 | 4/2011 |
| JP | 2012-501446 A | 1/2012 |
| JP | 2012/15007 | 8/2012 |
| KR | 2012-0040247 A | 4/2012 |
| KR | 2013 0019872 A | 2/2013 |
| WO | WO 88/09026 | 11/1988 |
| WO | WO 93/12403 | 6/1993 |
| WO | WO 94/08203 | 4/1994 |
| WO | WO 94/29672 | 12/1994 |
| WO | WO 95/18982 | 7/1995 |
| WO | WO 96/02849 A1 | 2/1996 |
| WO | WO 1999/49322 | 9/1999 |
| WO | WO 01/40790 | 6/2001 |
| WO | WO 01/74139 A2 | 10/2001 |
| WO | WO 01/74139 A3 | 10/2001 |
| WO | WO 03/069358 A2 | 8/2003 |
| WO | WO 03/069358 A3 | 8/2003 |
| WO | WO 03/107018 | 12/2003 |
| WO | WO 2004/027436 | 4/2004 |
| WO | WO 2004/072672 | 8/2004 |
| WO | WO 2005/013363 A2 | 2/2005 |
| WO | WO 2005/013363 A3 | 2/2005 |
| WO | WO 2006/035342 | 4/2006 |
| WO | WO 2006/056829 | 6/2006 |
| WO | WO 2006/083479 | 8/2006 |
| WO | WO 2007/095971 A1 | 8/2007 |
| WO | WO 2007/138508 | 12/2007 |
| WO | WO 2008/008140 A2 | 1/2008 |
| WO | WO 2008/008140 A3 | 1/2008 |
| WO | WO 2008/048379 | 4/2008 |
| WO | WO 2008/121443 | 10/2008 |
| WO | WO 2008/145662 | 12/2008 |
| WO | WO 2009/108422 A2 | 9/2009 |
| WO | Wo 2009/108422 A3 | 9/2009 |
| WO | WO 2010/014309 | 2/2010 |
| WO | WO 2010/027658 A2 | 3/2010 |
| WO | WO 2010/065315 | 6/2010 |
| WO | WO 2010/096367 | 8/2010 |
| WO | WO 2011/011479 | 1/2011 |
| WO | WO 2012/148646 | 11/2012 |
| WO | WO 2013/169455 | 11/2013 |
| WO | WO 2014/105302 A1 | 7/2014 |
| WO | WO 2015/009442 A1 | 1/2015 |
| WO | WO 2015/058733 | 4/2015 |

OTHER PUBLICATIONS

Request for Continued Examination (RCE) and Response to Final Office Action dated Feb. 8, 2022 for U.S. Appl. No. 15/606,332; RCE and Response filed Apr. 26, 2022; 24 Pages.

U.S. Notice of Allowance dated May 17, 2022 for U.S. Appl. No. 15/606,332; 11 Pages.

Response to European Examination Report dated Aug. 5, 2021 for European Application No. 18726263.9; Response filed May 6, 2022; 107 Pages.

U.S. Appl. No. 17/186,346, filed Feb. 26, 2021, Romero.

Ahn et al.; "A New Toroidal-Meander Type Integrated Inductor with a Multilevel Meander Magnetic Core;" IEEE Transaction on Magnetics; vol. 30; No. 1; Jan. 1, 1994; 7 pages.

Allegro "Two-Wire True Zero Speed Miniature Differential Peak-Detecting Gear Tooth Sensor;" ATS645LSH; 2004; Allegro MicroSystems, Inc., Worcester, MA 01615; 14 pages.

Allegro Microsystems, Inc., "Gear-Tooth Sensor For Automotive Applications," Aug. 3, 2001; 2 pages.

Allegro MicroSystems, Inc., Hall-Effect IC Applications Guide, http://www.allegromicro.com/en/Products/Design/an/an27701.pdf, Copyright 1987, 1997; 36 pages.

Alllegro "True Zero-Speed Low-Jitter High Accuracy Gear Tooth Sensor;" ATS625LSG; 2005; Allegro MicroSystems, Inc. Worcester, MA 01615; 21 pages.

Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; 8 pages.

Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; 4 pages.

Ausserlechner; "Limits of Offset Cancellation by the Principle of Spinning Current Hall Probe;" Proceedings of IEEE Sensors; Oct. 2004; 4 pages.

Ausserlechner; "The piezo-Hall effect in n-silicon for arbitrary crystal orientation;" Proceedings of IEEE Sensors; vol. 3; Oct. 24, 2004; ISBN: 0-7803-8692-2; 4 pages.

Bahreyni, et al.; "A Resonant Micromachined Magnetic Field Sensor;" IEEE Sensors Journal; vol. 7, No. 9, Sep. 2007; 9 pages.

(56) References Cited

OTHER PUBLICATIONS

Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; 12 pages.

Baschirotto et al.; "Development and Analysis of PCB Vector 2-D Magnetic Field Sensor System for Electronic Compass;" IEEE Sensors Journal vol. 6, No. 2; Apr. 2006; 7 pages.

Bilotti et al.; "Monolithic Magnetic Hall Sensor Using Dynamic Quadrature Offset Cancellation;" IEEE Journal of Solid-State Circuits; vol. 32, Issue 6; Jun. 1997; 8 pages.

Bowers et al., "Microfabrication and Process Integration of Powder-Based Permanent Magnets", Interdisciplinary Microsystems Group, Dept. Electrical and Computer Engineering, University of Florida, USA; Technologies for Future Micro-Nano Manufacturing Workshop, Napa, California, Aug. 8-10; 4 pages.

Daughton J: "Spin-dependent sensors", Proceedings of the IEEE New York, US, vol. 91. No.5 May 1, 2003; 6 pages.

Demierre, et al.; "Reference Magnetic Actuator for Self-Calibration of a Very Small Hall Sensor Array;" Sensors and Actuators A97-98; Apr. 2002; 8 pages.

Dwyer, "Back-Biased Packaging Advances (SE, SG & SH versus SA & SB)," http://www.allegromicro.com/en/Products/Design/packaging_advances/index.asp, Copyright 2008; 5 pages.

Frick, et al.; "CMOS Microsystem for AC Current Measurement with Galvanic Isolation;" IEEE Sensors Journal; vol. 3, No. 6; Dec. 2003; 9 pages.

Halg; "Piezo-Hall Coefficients of n-Type Silicon;" Journal of Applied Physics; vol. 64, No. 1; Jul. 1, 1988; 7 pages.

Honeywell International, Inc., "Hall Effect Sensing and Application," Micro Switch Sensing and Control, Chapter 3, http://content.honeywell.com/sensing/prodinfo/solidstate/technical/hallbook.pdf, date unavailable but believed to be before Jan. 2008; 11 pages.

Hosticka; "CMOS Sensor Systems;" Sensors and Actuators A66; Apr. 1998; 7 pages.

Infineon Product Brief, TLE 4941plusC, Differential Hall IC for Wheel Speed Sensing, Oct. 2010, www.infineon.com/sensors, 2 pages.

Johnson et al., "Hybrid Hall Effect Device," Appl. Phys. Lett., vol. 71, No. 7, Aug. 1997; 3 pages.

Kanda et al.; "The Piezo-Hall Effect in n-Silicon;" $22^{nd}$ International Conference on the Physics of Semiconductors; vol. 1, Jan. 1995; 4 pages.

Kapser et al.; "Integrated GMR Based Wheel Speed Sensor for Automotive Applications;" IEEE 2007 Conference on Sensors; Oct. 2007; 4 pages.

Kammerer et al.: "A Hall effect sensors network insensitive to mechanical stress;" Proceedings of IEEE Sensors; vol. 3, Oct. 2004; 4 pages.

Lagorce et al.; "Magnetic and Mechanical Properties of Micromachined Strontium Ferrite/Polyimide Composites;" Journal of Microelectromechanical Systems; vol. 6, No. 4; Dec. 1997; 15 pages.

Lequesne et al.; "High-Accuracy Magnetic Position Encoder Concept;" IEEE Transactions on Industry Applications; vol. 35, No. 3; May/Jun. 1999; 9 pages.

Magnani et al.; "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; 4 pages.

Manic et al.; "Short and Long-Term Stability Problems of Hall Plates in Plastic Packages;" IEEE $38^{th}$ Annual International Reliability Physics Symposium; Apr. 2000; 6 pages.

Manic; "Drift in Silicon Integrated Sensors and Circuits Due to the Thermo-Mechanical Stresses;" Lausanne, École Polytechnique Fédérale De Lausanne 2000; 176 pages.

Melexis Microelectronic Systems, Hall Applications Guide, Section 3—Applications, 1997; 48 pages.

Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; 7 pages.

Motz, et al.; "A Chopped Hall Sensor with Small Jitter and Programmable "True Power-On" Function;" IEEE Journal of Solid-State Circuits; vol. 40, No. 7; Jul. 2005; 8 pages.

Motz, et al.; "An Integrated Hall Sensor Platform Design for Position, Angle and Current Sensing;" IEEE Sensors 2006; Exco, Daegu, Korea / Oct. 22-25, 2006; 4 pages.

Munter; "A Low-offset Spinning-current Hall Plate;" Sensors and Actuators A21-A23; 1990; 4 pages.

Munter; "Electronic Circuitry for a Smart Spinning-current Hall Plate with Low Offset;" Sensors and Actuators A; Jun. 1991; 5 pages.

Oniku et al.; "High-Energy-Density Permanent Micromagnets Formed from Heterogeneous Magnetic Powder Mixtures;" IEEE $25^{th}$ International Conference on Micro Electro Mechanical Systems, Jan. 2012; 4 pages.

Park et al.; "Ferrite-Based Integrated Planar Inductors and Transformers Fabricated at Low Temperature;" IEEE Transactions on Magnetics; vol. 33; No. 5; Sep. 1997; 3 pages.

Park et al.;"Batch-Fabricated Microinductors with Electroplated Magnetically Anisotropic and Laminated Alloy Cores", IEEE Transactions on Magnetics, vol. 35, No. 5, Sep. 1999, 10 pages.

Partin et al.; "Temperature Stable Hall Effect Sensors;" IEEE Sensors Journal, vol. 6, No. 1; Feb. 2006; 5 pages.

Pastre, et al.; "A Hall Sensor Analog Front End for Current Measurement with Continuous Gain Calibration;" IEEE Sensors Journal; vol. 7, No. 5; May 2007; 8 pages.

Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; 4 pages.

Popovic; "Sensor Microsystems;" Proc. $20^{th}$ International Conference on Microelectronics (MWIL 95); vol. 2, NIS, Serbia, 12-14; Sep. 1995; 7 pages.

Randhawa; "Monolithic Integrated Hall Devices in Silicon Circuits;" Microelectronics Journal; vol. 12, No. 6; Sep. 14-17, 1981; 6 pages.

Ruther et al.; "Integrated CMOS-Based Sensor Array for Mechanical Stress Mapping;" $5^{th}$ IEEE Conference on Sensors, Oct. 2007; 4 pages.

Ruther et al.; "Thermomagnetic Residual Offset in Integrated Hall Plates;" IEEE Sensors Journal; vol. 3, No. 6; Dec. 2003; 7 pages.

Sargent; "Switched-capacitor IC controls feedback loop;" EDN; Design Ideas; Feb. 17, 2000; 2 pages.

Schneider; "Temperature Calibration of CMOS Magnetic Vector Probe for Contactless Angle Measurement System," IEDM 1996 4 Pages.

Schott et al.; "Linearizing Integrated Hall Devices;" 1997 International Conference on Solid-State Sensors and Actuators, Jun. 16-19, 1997; 4 Pages.

Schott, et al.; "CMOS Single-Chip Electronic Compass with Microcontroller;" IEEE Journal of Solid-State Circuits; vol. 42, No. 12; Dec. 2007; 11 pages.

Simon et al.; "Autocalibration of Silicon Hall Devices;" $8^{th}$ International Conference on Solid-State Sensors and Actuators; vol. 2; Jun. 25, 1995; 4 pages.

Smith et al.; "Low Magnetic Field Sensing with GMR Sensors;" Sensor Magazine; Part 1; Sep. 1999; http://archives.sensorsmag.com/articles/0999/76mail.shtml; 8 pages.

Smith et al.; "Low Magnetic Field Sensing with GMR Sensors;" Sensor Magazine; Part 2; Oct. 1999; http://archives.sensorsmag.com/articles/1099/84/mail.shtml; 11 pages.

Steiner et al.; "Double-Hall Sensor with Self-Compensated Offset;" International Electron Devices Meeting; Dec. 7, 1997; ISBN: 0-7803-4100-7; 4 pages.

Steiner et al; Offset Reduction in Hall Devices by Continuous Spinning Current Method; Sensors and Actuators A66; 1998; 6 pages.

Stellrecht et al.; Characterization of Hygroscopic Swelling Behavior of Mold Compounds and Plastic Packages; IEEE Transactions on Components and Packaging Technologies; vol. 27, No. 3; Sep. 2004; 8 pages.

(56) References Cited

OTHER PUBLICATIONS

Tian et al.; "Multiple Sensors on Pulsed Eddy-Current Detection for 3-D Subsurface Crack Assessment;" IEEE Sensors Journal, vol. 5, No. 1; Feb. 2005; 7 pages.
Trontelj et al; "CMOS Integrated Magnetic Field Source Used as a Reference in Magnetic Field Sensors on Common Substrate;" WEP 1-6; IMTC; May 1994; 3 pages.
Udo; "Limits of Offset Cancellation by the Principle of Spinning Current Hall Probe;" Proceedings of IEEE Sensors; Oct. 2004; 4 pages.
Wu, et al.; "A Chopper Current-Feedback Instrumentation Amplifier with a 1mHz 1/fNoise Corner and an AC-Coupled Ripple-Reduction Loop;" IEEE International Solid-State Circuits Conference; Feb. 10, 2009; 3 pages.
Zou et al.; "Three-Dimensional Die Surface Stress Measurements in Delaminated and Non-Delaminated Plastic Packages;" 48th Electronic Components and Technology Conference; May 25, 1998; 12 pages.
Office Action in dated Jan. 15, 2014, U.S. Appl. No. 13/468,478 36 pages.
Response to U.S. Non-Final Office Action dated Jan. 15, 2014 for U.S. Appl. No. 13/468,478; Response filed on Jun. 12, 2014; 11 Pages.
U.S. Final Office Action dated Jul. 17, 2014 for U.S. Appl. No. 13/468,478; 13 Pages.
Response and RCE to U.S. Final Office Action dated Jul. 17, 2014 for U.S. Appl. No. 13/468,478; Response Filed Jan. 19, 2015; 12 Pages.
U.S. Non-Final Office Action dated Feb. 12, 2015 for U.S. Appl. No. 13/468,478; 14 Pages.
Response to U.S. Non-Final Office Action dated Feb. 12, 2015 for U.S. Appl. No. 13/468,478; Response filed Jun. 18, 2015; 11 Pages.
U.S. Final Office Action dated Sep. 16, 2015 for U.S. Appl. No. 13/468,478; 19 Pages.
Response (with RCE) to U.S. Final Office Action dated Sep. 16, 2015 for U.S. Appl. No. 13/468,478; Response filed Jan. 14, 2016; 18 Pages.
U.S. Non-Final Office Action dated May 10, 2016 corresponding to U.S. Appl. No. 13/468,478; 20 Pages.
Response filed on Oct. 3, 2016 to the Office Action dated May 10, 2016; for U.S. Appl. No. 13/468,478; 17 pages.
U.S. Final Office Action dated Feb. 10, 2017 for U.S. Appl. No. 13/468,478; 27 Pages.
Response to U.S. Final Office Action dated Feb. 10, 2017 for U.S. Appl. No. 13/468,478; Response filed on May 3, 2017; 9 Pages.
Notice of Allowance dated May 15, 2017 for U.S. Appl. No. 13/468,478; 15 Pages.
Notice of Allowance dated Jul. 25, 2017 for U.S. Appl. No. 13/468,478; 10 Pages.
PCT International Search Report and Written Opinion dated Jul. 13, 2013 for International Application No. PCT/US2013/037065; 13 pages.
PCT International Preliminary Report on Patentability and Written Opinion of the ISA dated Nov. 20, 2014; For PCT Pat. App. No. PCT/US2013/037065; 11 pages.
European Communication under Rule 71(3) EPC, Intention to Grant dated Jun. 2, 2016 corresponding to European Application No. 13722619.7; 26 Pages.
European Response to Written Opinion filed on May 21, 2015; for European Pat. App. No. 13722619.7, 9 pages.
Decision to Grant dated Oct. 27, 2016; for European Pat. App. No. 13722619.7; 2 pages.
Japanese Office Action (with English Translation) dated Jan. 13, 2017 for Japanese Application No. 2015-511491; 14 Pages.
Response (with Amended Claims in English) to Japanese Office Action dated Feb. 13, 2017 for Japanese Application No. 2015-511491; Response filed on Apr. 11, 2017; 10 Pages.
Appeal Brief dated Sep. 19, 2017 from Japanese Application No. 2015-511491 with English translations; 14 Pages.
Pre-Trial Report dated Nov. 2, 2017 from Japanese Application No. 2015-511491 with English translations and Claims on File; 7 Pages.
Japanese Office Action (with English Translation) dated May 18, 2017 for Japanese Application No. 2015-511491; 8 Pages.
Japanese Petition (with Machine English Translation) filed Jan. 24, 2018 for Japanese Application No. 2015-511491; 10 Pages.
Japanese Office Action (with English Translation) dated May 16, 2018 for Japanese Application No. 2015-511491; 9 Pages.
Response filed on Nov. 14, 2018 for Japanese Application No. 2015-511491 with English Translation; 11 Pages.
Japanese Office Action dated Dec. 17, 2018 for Japanese Application No. 2015-511491; 10 pages.
Response filed on Mar. 14, 2019 for Japanese Application No. 2015-511491 with English Machine Translation; 12 Pages.
Japanese Notice of Allowance (with English Translation of Allowed Claims) dated May 16, 2019 for Japanese Application No. 2015-511491; 6 Pages.
Korean Office Action (with English Translation) dated Dec. 20, 2017 corresponding to Korean Appl. No. 10-2014-7032857; 14 Pages.
Response (with English Translation) to Korean Notice of Reasons for Refusal dated Dec. 20, 2017 for Korean Application No. 10-2014-7032857; Response filed Feb. 14, 2018; 47 Pages.
Korean Notice of Allowance (with English translation and allowed claims) dated Jun. 29, 2018 for Korean Application No. 10-2014-7032857; 8 pages.
U.S. Non-Final Office Action dated Jan. 9, 2018 corresponding to U.S. Appl. No. 15/709,739; 12 Pages.
Response to U.S. Non-Final Office Action dated Jan. 9, 2018 for U.S. Appl. No. 15/709,739; Response filed Jun. 25, 2018; 11 pages.
Office Action dated Oct. 25, 2018 for U.S. Appl. No. 15/709,739; 14 Pages.
Response to Office Action dated Oct. 25, 2018 for U.S. Appl. No. 15/709,739, filed Jan. 18, 2019; 10 Pages.
Non-Final Office Action dated Mar. 8, 2019 for U.S. Appl. No. 15/709,739; 15 Pages.
Response to U.S. Non-Final Office Action dated Mar. 8, 2019 for U.S. Appl. No. 15/709,739; Response filed Jun. 10, 2019; 15 Pages.
U.S. Final Office Action dated Sep. 19, 2019 for U.S. Appl. No. 15/709,739; 24 Pages.
Appeal Brief filed on Mar. 19, 2020 for U.S. Appl. No. 15/709,739; 18 Pages.
U.S. Non-Final Office Action dated Jul. 28, 2020 for U.S. Appl. No. 15/709,739; 19 Pages.
Response to Office Action filed on Nov. 12, 2020 for U.S. Appl. No. 15/709,739; 17 pages.
U.S. Final Office Action dated Mar. 2, 2021 for U.S. Appl. No. 15/709,739; 17 Pages.
Appeal Brief filed on Aug. 17, 2021 for U.S. Appl. No. 15/709,739; 15 Pages.
Examiner's Answer dated Dec. 22, 2021 for U.S. Appl. No. 15/709,739; 7 pages.
European Extended Search Report dated Dec. 22, 2016; for European Pat. App. No. 16193227.2; 11 pages.
Response to European Office Action filed on Oct. 2, 2017 for European Application No. 16193227.2; 7 pages.
European Examination Report dated May 15, 2020 for European Application No. 16193227.2; 8 Pages.
Response to European Office Action filed on Sep. 15, 2020 for European Application No. 16193227.2; 9 pages.
European Intention to Grant dated Mar. 10, 2021 for European Application No. 16193227.2; 7 Pages.
Japanese Office Action with English Translations for Japanese Application No. 2017-178549 dated Jul. 30, 2018; 4 Pages.
Response filed on Nov. 14, 2018 for Japanese Application No. 2017-178549 with English Translation; 13 Pages.
Notice of Allowance dated Apr. 16, 2019 for Japanese Application No. 2017-178549 with English Translation of Allowed claims; 8 Pages.
Office Action dated Jan. 5, 2015 for U.S. Appl. No. 13/946,400; 56 Pages.
Response to Office Action dated Jan. 5, 2015, filed Apr. 3, 2015; for U.S. Appl. No. 13/946,400; 13 pages.

(56) References Cited

OTHER PUBLICATIONS

Final Office Action dated Jun. 9, 2015; for U.S. Appl. No. 13/946,400; 17 pages.
Amendment and RCE filed on Sep. 9, 2015; for U.S. Appl. No. 13/946,400; 12 pages.
Office Action dated Nov. 19, 2015; for U.S. Appl. No. 13/946,400; 24 pages.
Response to U.S. Non-Final Office Action dated Nov. 19, 2015 for U.S. Appl. No. 13/946,400; Response filed Feb. 17, 2016; 11 Pages.
Final Office Action dated Oct. 20, 2016 for U.S. Appl. No. 13/946,400; 34 pages.
Response to Final Office Action dated Oct. 20, 2016, filed on Jan. 19, 2017; for U.S. Appl. No. 13/946,400; 12 Pages.
Response to U.S. Final Office Action dated Oct. 20, 2016 (w/RCE) for U.S. Appl. No. 13/946,400; Response filed on Feb. 23, 2017; 17 Pages.
Advisory Action dated Feb. 16, 2017 for U.S. Appl. No. 13/946,400; 4 Pages.
Office Action dated Apr. 6, 2017 for U.S. Appl. No. 13/946,400; 36 Pages.
Response to Office Action filed on Jun. 30, 2017 for U.S. Appl. No. 13/946,400; 12 pages.
Final Office Action dated Oct. 5, 2017 for U.S. Appl. No. 13/946,400; 39 pages.
Response to U.S. Final Office Action dated Oct. 5, 2017 for U.S. Appl. No. 13/946,400; Response filed Jan. 5, 2018; 11 Pages.
Response to Final Office Action dated Oct. 5, 2017 for U.S. Appl. No. 13/946,400; Response filed on Feb. 27, 2018; 14 Pages.
Notice of Allowance dated Apr. 4, 2018 for U.S. Appl. No. 13/946,400; 11 pages.
International Search Report and Written Opinion dated Nov. 3, 2014 for Int'l PCT Application PCT/US2014/044993; 13 pages.
International Preliminary Report on Patentability dated Jan. 19, 2016 for Int'l PCT Application PCT/US2014/044993; 9 pages.
Communication Pursuant to Rule 161(1) and 162 EPC dated Feb. 23, 2016; for European Pat. App. No. 14742423.8; 2 pages.
European Response filed on Aug. 24, 2016 to the official communication dated Feb. 23, 2016; for European Pat. App. No. 14742423.8; 13 pages.
European Examination Report dated Jan. 27, 2020 for European Application No. 14742423.8; 7 Pages.
Response (with Amended Claims) to European Examination Report dated Jan. 27, 2020 for European Application No. 14742423.8; Response Filed May 27, 2020; 10 Pages.
Japanese Voluntary Amendment with English Claims dated Dec. 28, 2016; for Japanese Pat. App. No. 2016-528006; 8 pages.
Japanese Office Action with English translation dated Oct. 3, 2017 for Japanese Application No. 2016-528006; 6 Pages.
Response to Japanese Office Action (with English claims) dated Oct. 3, 2017 for Japanese Application No. 2016-528006; Response filed Dec. 26, 2017; 8 Pages.
Japanese Office Action (with English translation) dated Jun. 1, 2018 for Japanese Application No. 2016-528006; 7 pages.
Response to Japanese Office Action with English translations of Amended Claims for Japanese Application No. 2016-528006 as filed on Aug. 3, 2018; 7 Pages.
Japanese Notice of Allowance (with English Translation) dated Sep. 28, 2018, for Japanese Application No. 2016-528006; 6 Pages.
Voluntary Amendment dated Nov. 2, 2016 with English claims for Chinese Application No. 201480040243.6; 13 pages.
Chinese Office Action (w/English Translation) dated Feb. 1, 2018 for Chinese Application No. 201480040243.6; 26 Pages.
Response to Chinese Office Action dated Feb. 1, 2018 for Chinese Application No. 201480040243.6; Response filed Jun. 14, 2018; 11 pages.
Second Office Action dated Oct. 9, 2018 for Chinese Application No. 201480040243.6 with English Translations; 23 Pages.
Chinese Response (w/English Claims and Remarks) filed Dec. 24, 2018 for Chinese Application No. 201480040243.6; 14 pages.
Office Action dated Mar. 22, 2019 for Chinese Application No. 201480040243.6 with English Translation; 22 Pages.
Response filed on Jun. 6, 2019 for Chinese Application No. 201480040243.6; 17 Pages.
Chinese Decision on Rejection (with English Translation) dated Sep. 3, 2019 for Chinese Application No. 201480040243.6; 23 Pages.
Response with English Translation and Amended Claims in English to Chinese Office Action dated Sep. 3, 2019 for Chinese Application No. 2014800402436; Response filed on Dec. 17, 2019; 17 Pages.
Chinese Notice of Grant (with English Translation and Allowed Claims) dated Jan. 9, 2020 for Chinese Application No. 201480040243.6; 11 Pages.
Voluntary Amendment with English Claims dated Nov. 7, 2016 for Korean App. No. 10-2016-7004178; 11 Pages.
Korean Office Action with English Translation dated Nov. 22, 2017 for Korean Application No. 102016-7004178; 17 Pages.
Korean Response (with English Language Summary) dated Jan. 19, 2018 for Korean Application No. 10-2016-7004178; 25 Pages.
Korean Office Action (with English Translation) dated May 30, 2018 for Korean Application No. 10-2016-7004178; 11 Pages.
Response to Korean Office Action dated May 30, 2018 for Korean Application No. 10-2016-7004178; Response (with English claims) filed Jul. 19, 2018; 41 pages.
Korean Notice of Allowance (with English Translation) dated Oct. 2, 2018, for Korean Application No. 10-2016-7004178; 5 Pages.
U.S. Non-Final Office Action dated Oct. 5, 2018, for U.S. Appl. No. 16/029,826; 61 Pages.
Response to U.S. Non-Final Office Action dated Oct. 5, 2018 for U.S. Appl. No. 16/029,826; Response filed Feb. 1, 2019; 10 pages.
U.S. Final Office Action dated Sep. 19, 2019 for U.S. Appl. No. 16/029,826; 22 Pages.
Response to U.S. Final Office Action dated Sep. 19, 2019 for U.S. Appl. No. 16/029,826; Response filed Oct. 21, 2019; 12 Pages.
U.S. Non-Final Office Action dated Nov. 29, 2019 for U.S. Appl. No. 16/029,826; 30 Pages.
Response to Office Action dated Jan. 17, 2020 for U.S. Appl. No. 16/029,826; 14 pages.
U.S. Notice of Allowance dated Mar. 23, 2020 for U.S. Appl. No. 16/029,826; 13 Pages.
U.S. Non-Final Office Action dated Feb. 19, 2021 for U.S. Appl. No. 16/856,582; 37 Pages.
Response to U.S. Non-Final Office Action dated Feb. 19, 2021 for U.S. Appl. No. 16/856,582; Response Filed Mar. 2, 2021; 11 Pages.
Examiner's Notice dated May 28, 2021 for U.S. Appl. No. 16/856,582; 2 Pages.
Response to U.S. Office Communication dated May 28, 2021 for U.S. Appl. No. 16/856,582; Response filed Jun. 3, 2021; 11 Pages.
U.S. Final Office Action dated Sep. 14, 2021 for U.S. Appl. No. 16/856,582; 21 Pages.
Response to Office Action dated Sep. 14, 2021 filed on Dec. 14, 2021 for U.S. Appl. No. 16/856,582; 13 pages.
U.S. Non-Final Office Action dated Aug. 24, 2015 for U.S. Appl. No. 13/891,519; 14 pages.
Response to U.S. Non-Final Office Action dated Aug. 24, 2015 for U.S. Appl. No. 13/891,519; Response filed on Nov. 20, 2015; 11 pages.
U.S. Final Office Action dated Feb. 16, 2016 for U.S. Appl. No. 13/891,519; 14 pages.
Response and RCE to U.S. Final Office Action dated Feb. 16, 2016 for U.S. Appl. No. 13/891,519; Response filed on May 12, 2016; 16 pages.
U.S. Non-Final Office Action dated Jun. 3, 2016 for U.S. Appl. No. 13/891,519; 17 pages.
Response to U.S. Non-Final Office Action dated Jun. 3, 2016 for U.S. Appl. No. 13/891,519; Response filed on Sep. 1, 2016; 14 pages.
U.S. Final Office Action dated Nov. 25, 2016 for U.S. Appl. No. 13/891,519; 13 pages.
Response and RCE to U.S. Final Office Action dated Nov. 25, 2016 for U.S. Appl. No. 13/891,519; Response filed on Feb. 6, 2017; 18 pages.

(56) References Cited

OTHER PUBLICATIONS

Notice of Allowance dated Mar. 1, 2017 for U.S. Appl. No. 13/891,519; 7 pages.
Notice of Allowance dated Apr. 19, 2017 for U.S. Appl. No. 13/891,519; 11 pages.
PCT International Search Report and Written Opinion dated Sep. 12, 2014 for International Application No. PCT/US2014/035594; 16 pages.
PCT International Preliminary Report dated Nov. 19, 2015 for International Application No. PCT/US2014/035594; 13 pages.
Communication Pursuant to Rules 161(1) and 162 dated Nov. 12, 2015 for European Application No. 14726492.3-1560; 2 pages.
Response to Communication dated Dec. 11, 2015 for European Application No. 14726492.3-1560; 17 pages.
Intention of Grant dated May 27, 2019 for for European Application No. 14726492.3-1560; 7 pages.
Japanese Office Action dated Jan. 18, 2017 for Japanese Application No. 2016-512930; 7 pages.
Response to Japanese Office Action dated Jan. 18, 2017 for Japanese Application No. 2016-512930; Response Filed Apr. 18, 2017; 13 pages.
Japanese Decision of Grant dated Oct. 25, 2018 for Japanese Application No. 2016-512930; Response Filed Apr. 18, 2017; 27 pages.
Office Action dated Mar. 20, 2015; for U.S. Appl. No. 13/946,417; 54 pages.
Response filed on Jun. 19, 2015 to Office Action dated Mar. 20, 2015; for U.S. Appl. No. 13/946,417; 15 pages.
Final Office Action dated Aug. 28, 2015; for U.S. Appl. No. 13/946,417; 34 pages.
Response filed Nov. 9, 2015 to Final Office Action dated Aug. 28, 2015; For U.S. Appl. No. 13/946,417; 17 pages.
Non-Final Office Action dated Dec. 3, 2015; for U.S. Appl. No. 13/946,417; 29 pages.
Response filed Mar. 3, 2016 to Office Action dated Dec. 3, 2015; For U.S. Appl. No. 13/946,417; 17 pages.
Final Office Action dated Oct. 6, 2016; for U.S. Appl. No. 13/946,417; 45 pages.
Response and RCE to Oct. 6, 2016 Final Office Action from U.S. Appl. No. 13/946,417 , filed Jan. 24, 2017; 14 Pages.
U.S. Non-Final Office Action dated Mar. 15, 2017 from U.S. Appl. No. 13/946,417; 43 Pages.
Response to U.S. Non-Final Office Action dated Mar. 15, 2017 for U.S. Appl. No. 13/946,417; Response filed on Jun. 14, 2017; 10 pages.
U.S. Final Office Action dated Sep. 8, 2017 for U.S. Appl. No. 13/946,417; 56 pages.
Response to Final Office Action dated Sep. 8, 2017 for U.S. Appl. No. 13/946,417; Response filed Nov. 29, 2017; 16 Pages.
U.S. Non-Final Office Action dated Feb. 8, 2018 for U.S. Appl. No. 13/946,417; 37 Pages.
Response to U.S. Non-Final Office Action dated Feb. 8, 2018 for U.S. Appl. No. 13/946,417; Response filed Apr. 19, 2018; 14 Pages.
U.S. Final Office Action dated Jun. 15, 2018 for U.S. Appl. No. 13/946,417; 33 Pages.
Response to Final Office Action dated Jun. 15, 2018 for U.S. Appl. No. 13/946,417, filed Sep. 14, 2018; 15 Pages.
U.S. Non-Final Office Action dated Feb. 7, 2019 for U.S. Appl. No. 13/946,417; 35 pages.
Response to U.S. Non-Final Office Action dated Feb. 7, 2019 for U.S. Appl. No. 13/946,417; Response filed Apr. 22, 2019; 14 pages.
U.S. Notice of Allowance dated Sep. 11, 2019 for U.S. Appl. No. 13/946,417; 10 Pages.
U.S. Supplemental Notice of Allowability dated Oct. 2, 2019 for U.S. Appl. No. 13/946,417; 7 Pages.
International Search Report and Written Opinion dated Oct. 28, 2014 for Int'l PCT Application PCT/US2014/044991; 12 pages.
PCT International Preliminary Report and Written Opinion dated Jan. 28, 2016 for International Application No. PCT/US2014/044991; 9 pages.

U.S. Non-Final Office Action dated Jan. 24, 2019 for U.S. Appl. No. 15/606,358; 27 pages.
Response to Non-Final Office Action dated Jan. 24, 2019 for U.S. Appl. No. 15/606,358, filed Apr. 17, 2019; 12 Pages.
Non-Final Office Action dated Aug. 22, 2019 for U.S. Appl. No. 15/606,358; 32 Pages.
Response to U.S. Non-Final Office Action dated Aug. 22, 2019 for U.S. Appl. No. 15/606,358; Response filed Dec. 4, 2019; 20 Pages.
U.S. Final Office Action dated Mar. 6, 2020 for U.S. Appl. No. 15/606,358; 43 Pages.
Response to U.S. Final Office Action dated Mar. 6, 2020 for U.S. Appl. No. 15/606,358; Response filed Jul. 1, 2020; 16 Pages.
U.S. Notice of Allowance dated Feb. 16, 2021 for U.S. Appl. No. 15/606,358; 10 Pages.
PCT International Search Report and Written Opinion dated Nov. 23, 2018 for International Application No. PCT/US2018/028475; 17 pages.
PCT International Preliminary Report dated Dec. 5, 2019 for International Application No. PCT/US2018/028475; 11 Pages.
Communication pursuant to Rules 161(1) and 162 EPC dated Jan. 10, 2020 for European Application No. 18723635.1; 3 pages.
Response to European Rules 161/162 Communication dated Jan. 10, 2020 for European Application No. 18723635.1; Response filed Jul. 17, 2020; 18 Pages.
Japanese Office Action with English translation dated Dec. 1, 2021 for Japanese Application No. 2019-565299; 8 pages.
Chinese Office Action with English Translation dated Jun. 2, 2021 for Chinese Application No. 201880034849.7; 29 Pages.
Response (with English Translation) to $1^{st}$ Chinese Office Action dated Jun. 2, 2021 for Chinese Application No. 201880034849.7; Response filed on Jul. 30, 2021; 19 Pages.
$2^{nd}$ Chinese Office Action (with English Translation) dated Aug. 25, 2021 for Chinese Application No. 201880034849.7; 12 Pages.
Response (with English Translation) to $2^{nd}$ Chinese Office Action dated Aug. 25, 2021 for Chinese Application No. 201880034849.7; Response filed Sep. 28, 2021; 60 Pages.
Chinese Notice of Allowance (with English Translation and Allowed Claims) dated Oct. 18, 2021 for Chinese Application No. 201880034849.7; 9 Pages.
Restriction Requirement dated Jan. 10, 2019 for U.S. Appl. No. 15/606,332; 12 pages.
Response to Restriction Requirement dated Jan. 10, 2019 for U.S. Appl. No. 15/606,332, filed Mar. 6, 2019, 13 pages.
Office Action dated Jun. 13, 2019 for U.S. Appl. No. 15/606,332; 24 pages.
Response to Office Action dated Jun. 13, 2019, filed on Aug. 26, 2019, for U.S. Appl. No. 15/606,332; 18 pages.
Final Office Action dated Nov. 27, 2019 for U.S. Appl. No. 15/606,332; 29 pages.
Response to Final Office Action dated Nov. 27, 2019 filed on Feb. 7, 2020 for U.S. Appl. No. 15/606,332; 19 pages.
Office Action dated Apr. 2, 2020 for U.S. Appl. No. 15/606,332; 29 pages.
Response to Office Action dated Apr. 2, 2020, filed on Jun. 15, 2020, for U.S. Appl. No. 15/606,332; 20 pages.
Final Office Action dated Sep. 17, 2020 for U.S. Appl. No. 15/606,332; 21 pages.
Response to Final Office Action dated Sep. 17, 2020 filed on Dec. 2, 2020 for U.S. Appl. No. 15/606,332; 23 pages.
Office Action dated Mar. 24, 2021 for U.S. Appl. No. 15/606,332; 23 pages.
Response to Office Action dated Mar. 24, 2021 filed on Jun. 24, 2021 for U.S. Appl. No. 15/606,332; 21 pages.
PCT International Search Report and Written Opinion of the ISA dated Aug. 10, 2018 for PCT/US2018/028816; 23 Pages.
PCT International Preliminary Report dated Dec. 5, 2019 for International Application No. PCT/US2018/028816; 18 Pages.
Communication pursuant to Rules 161(1) and 162 EPC dated Jan. 10, 2020 for European Application No. 18726263.9; 3 pages.
Response to European Rules 161/162 Communication dated Jan. 10, 2020 for European Application No. 18726263.9; Response filed Jul. 10, 2020; 18 Pages.

(56) References Cited

OTHER PUBLICATIONS

European Examination Report dated Aug. 5, 2021 for European Application No. 18726263.9; 4 Pages.
Chinese Office Action (with English Translation) dated Mar. 3, 2021 for Chinese Application No. 201880034743.7; 22 Pages.
Response to Chinese Office Action dated Mar. 3, 2021 for Chinese Application No. 201880034743.7; Response filed on Jul. 16, 2021; 23 Pages.
$2^{nd}$ Chinese Office Action (with English Translation) dated Oct. 9, 2021 for Chinese Application No. 201880034743.7; 19 Pages.
Response (with English Translation) to $2^{nd}$ Chinese Office Action dated Oct. 9, 2021 for Chinese Application No. 201880034743.7; Response filed Dec. 23, 2021; 20 Pages.
Japanese Office Action with English translation dated Dec. 1, 2021 for Japanese Application No. 2019-565248; 44 pages.
Office Action dated Nov. 8, 2018 for U.S. Appl. No. 15/606,325; 24 Pages.
Response to Office Action dated Nov. 8, 2018 for U.S. Appl. No. 15/606,325; Response filed Feb. 7, 2019; 14 pages.
Final Office Action dated May 16, 2019 for U.S. Appl. No. 15/606,325; 24 Pages.
Response to Final Office Action dated May 16, 2019 for U.S. Appl. No. 15/606,325, filed Aug. 14, 2019; 15 Pages.
U.S. Notice of Allowance dated Jul. 28, 2020 for U.S. Appl. No. 15/606,325, 33 pages.
PCT International Search Report and Written Opinion dated Nov. 30, 2018 for International Application No. PCT/US2018/028821; 12 pages.
PCT International Preliminary Report dated Dec. 5, 2019 for International Application No. PCT/US2018/028821; 8 Pages.
Communication pursuant to Rules 161(1) and 162 EPC dated Jan. 10, 2020 for European Application No. 18723644.3; 3 pages.
Response to European Office Action filed on Jul. 17, 2020 for European Application No. 18723644.3; 17 pages.
Japanese Voluntary Amendment (with Machine English Translation from Espacenet.com) filed on Nov. 13, 2020 for Japanese Application No. 2019-565298; 4 Pages.
Japanese Office Action with English translation dated Nov. 2, 2021 for Japanese Application No. 2019-565298; 14 pages.
Chinese Office Action with English Translation dated Jun. 18, 2021 for Chinese Application No. 201880034726.3; 21 Pages.
Response (with English Translation) to $1S^r$ Chinese Office Action dated Jun. 18, 2021 for Chinese Application No. 201880034726.3; Response filed on Aug. 23, 2021; 18 Pages.
Chinese $2^{nd}$ Office Action (with English Translation) dated Oct. 21, 2021 for Chinese Application No. 201880034726.3; 10 Pages.
Chinese Response to Office Action with English translation filed on Dec. 31, 2021 for Chinese Application No. 201880034726.3; 33 pages.
Office Action dated Nov. 13, 2020 for U.S. Appl. No. 16/282,539; 14 pages.
Response to Office Action filed on Feb. 12, 2021 for U.S. Appl. No. 16/282,539; 16 pages.
Notice of Allowance dated May 26, 2021 for U.S. Appl. No. 16/282,539; 5 pages.
European Extended Search Report dated Jul. 12, 2019 for European Application No. 19158961.3; 10 Pages.
Response (with Amended Claims) to European Official Communication dated Sep. 2, 2019 for European Application No. 19158961.3; Response filed Feb. 24, 2020; 44 Pages.
European Intention to Grant dated Mar. 10, 2021 for European Application No. 19158961.3; 7 Pages.
Notice of Allowance dated Sep. 29, 2021 for U.S. Appl. No. 16/870,265; 10 pages.
Korean Office Action (with Machine English Translation from Espacenet.com) dated Jun. 29, 2022 for Korean Application No. 10-2019-7035015; 6 Pages.
U.S. Final Office Action dated Feb. 8, 2022 for U.S. Appl. No. 15/606,332; 22 Pages.
Chinese Notice of Granting a Patent (with English Translation and Allowed Claims) dated Feb. 11, 2022 for Chinese Application No. 201880034743.7; 13 Pages.
Response (with Machine English Translation from Espacenet.com) to Japanese Office Action dated Dec. 1, 2021 for Japanese Application No. 2019-565248; Response filed Mar. 1, 2022; 25 Pages.

* cited by examiner

ANGLE SENSOR USING EDDY CURRENTS

BACKGROUND

Magnetic field sensors are used to detect a target. For example, high frequency magnetic field generation and detection is used to determine features of the target such as cracks or other defects in metals in NDT (Non-Destructive Testing).

Magnetic field sensors are also used detect motion (e.g., rotation) and/or position of a target (e.g., angular position). Such sensors are ubiquitous in many areas of technology including robotics, automotive, manufacturing, etc. Magnetic field sensors generally employ one or more magnetic field sensing elements, such as Hall effect elements, magnetoresistive elements, etc. Element types and their position relative to a magnetic field can be selected so that they are relatively sensitive or insensitive to the magnetic field.

SUMMARY

Example embodiments of the disclosure provide a magnetoresistance-based angle sensor that includes sensing elements configured to detect quadrature components of a reflected magnetic field generated by eddy currents in a target. A coil generates the eddy currents in the target and the target is configured so that the reflected magnetic field has a symmetric gradient different from zero with respect to the target axis of rotation. The magnetoresistance elements can be operated in the linear region and their ability to detect quadrature field components can be achieved by repining and/or by having different shape anisotropies.

According to an aspect of the disclosure, a magnetic field angle sensor includes a coil configured to generate a magnetic field that induces an eddy current in a rotatable target, a first magnetic field sensing structure comprising at least one first magnetoresistance element positioned proximate to the coil and configured to detect a reflected magnetic field generated by the eddy current induced in the target and a second magnetic field sensing structure positioned comprising at least one second magnetoresistance element proximate to the coil and configured to detect the reflected magnetic field generated by the eddy current induced in the target, wherein the first and second magnetic field sensing structures are configured to detect quadrature components of the reflected magnetic field. The magnetic field angle sensor further includes a processing module configured to process the reflected magnetic field detected by the first and second magnetic field sensing structures for determining an angular position of the target.

Features can include one or more of the following individually or in combination with other features. An axis of rotation of the target can be centered with respect to the coil. The coil, the first magnetic field sensing structure, and the second magnetic field sensing structure can be supported by a semiconductor die and the target can have an inclined surface proximate to the semiconductor die. The reflected field gradient is symmetric with respect to the axis of rotation of the target and can correspond to conductive properties of the inclined surface of the target. Each of the first magnetic field sensing structure and the second magnetic field sensing structure can include one or more TMR elements operated in the linear region.

In embodiments, the first magnetic field sensing structure can include at least one first TMR element having a first reference layer and a first biased free layer and the second magnetic field sensing structure can include at least one second TMR element having a second reference layer and a second biased free layer, wherein each of the second reference layer and the second biased free layer is oriented at ninety degrees with respect to the first reference layer and the first biased free layer. In embodiments, the first magnetic field sensing structure can have a first shape anisotropy configured to provide the first magnetic field sensing structure with a first maximum response axis and the second magnetic field sensing structure can have a second shape anisotropy configured to provide the second magnetic field sensing structure with a second maximum response axis that is orthogonal with respect to the first maximum response axis.

Each of the first and second magnetic field sensing structures can include a plurality of magnetic field sensing elements electrically coupled in a bridge configuration. The processing module can be further configured to compute the angular position of the target based on a ratio of a signal from the second magnetic field sensing structure and a signal from the first magnetic field sensing structure. The processing module can be configured to compute an arctangent function based on a ratio of a signal from the second magnetic field sensing structure and a signal from the first magnetic field sensing structure. The coil can include at least two turns spaced by a gap and the first and second magnetic field sensing structures can be positioned in the gap. The coil, the first magnetic field sensing structure, and the second magnetic field sensing structure can be configured such that a directly coupled magnetic field generated by the coil and experienced by the first and second magnetic field sensing structures is substantially zero.

Also described is a method including generating a magnetic field with a coil, wherein the magnetic field induces an eddy current in a rotatable target, detecting a reflected magnetic field generated by the eddy current induced in the target with first and second magnetic field sensing structures each comprising at least one magnetoresistance element, wherein the first and second magnetic field sensing structures are configured to detect quadrature components of the reflected magnetic field, and processing the reflected magnetic field from the first and second magnetic field sensing structures to determine an angular position of the target.

Features can include one or more of the following individually or in combination with other features. Detecting the reflected magnetic field can include detecting a non-zero gradient reflected magnetic field that is symmetric with respect to an axis of rotation of the target and that corresponds to conductive properties of an inclined surface of the target. Detecting the reflected magnetic field with first and second magnetic field sensing structures that are configured to detect quadrature components of the reflected magnetic field can include detecting the reflected magnetic field with one or more TMR elements operated in the linear region. Processing the reflected magnetic comprises computing the angular position of the target based on a ratio of a signal from the second magnetic field sensing structure and a signal from the first magnetic field sensing structure. The method can further include positioning the coil and the first and second magnetic field sensing structures such that a directly coupled magnetic field generated by the coil and experienced by the first and second magnetic field sensing structures is substantially zero.

According to a further aspect of the disclosure, a magnetic field angle sensor can include means configured to generate a magnetic field that induces an eddy current in a rotatable target, first magnetic field sensing means comprising at least one first magnetoresistance element positioned proximate to the magnetic field generating means and configured to detect a symmetric gradient reflected magnetic field generated by the eddy current induced in the target, and second magnetic field sensing means comprising at least one second magnetoresistance element positioned proximate to the magnetic field generating means and configured to detect the reflected magnetic field generated by the eddy current induced in the target, wherein the first and second magnetic field sensing means are configured to detect quadrature components of the reflected magnetic field. The magnetic field angle sensor can further include processing means configured to process the reflected magnetic field detected by the first and second magnetic field sensing means for determining an angular position of the target. In embodiments, the reflected magnetic field can have a gradient that is symmetric with respect to an axis of rotation of the target and correspond to conductive properties of an inclined surface of the target.

BRIEF DESCRIPTION OF THE DRAWINGS

Other aspects, features, and advantages of the disclosure will become more fully apparent from the following detailed description, the appended claims, and the accompanying drawings in which like reference numerals identify similar or identical elements. Reference numerals that are introduced in the specification in association with a drawing figure can be repeated in one or more subsequent figures without additional description in the specification in order to provide context for other features.

DETAILED DESCRIPTION

Figure 1:
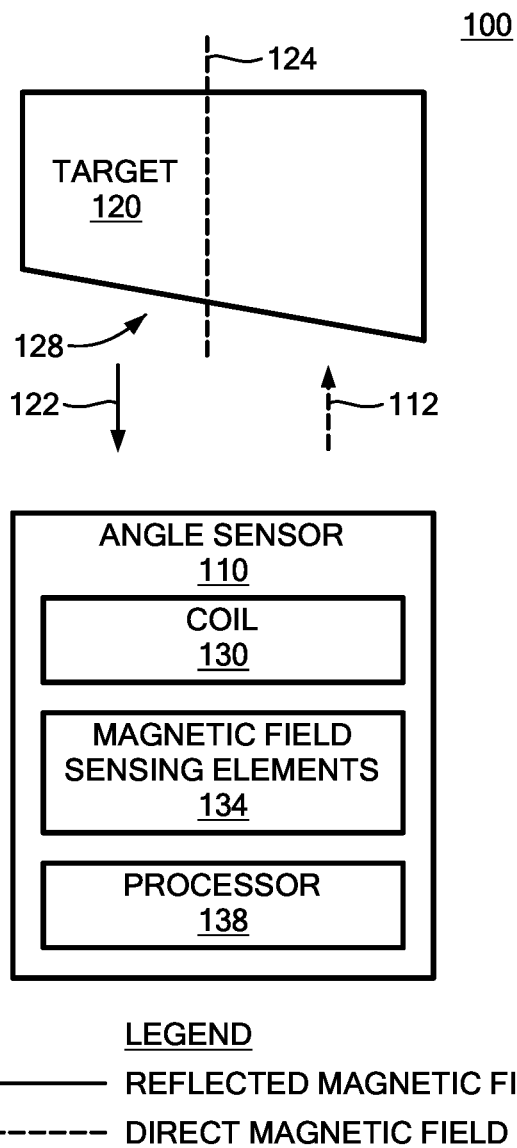
FIG. 1 is a diagram of an example of angle sensing system including a sensor and a target, according to aspects of the disclosure.

FIG. 1 is a diagram of an example of a system 100 according to aspects of the disclosure. System 100 includes an angle sensor 110 and a conductive, rotatable target 120. The sensor 110 includes at least one coil 130, magnetic field sensing elements 134, and a processor 138. The coil 130 is configured to generate a first magnetic field 112 (herein a "direct magnetic field 112") that induces eddy currents in the conductive target 120. The eddy currents result in generation of a second magnetic field 122 (herein a "reflected magnetic field 122").

Sensor 110 can detect the reflected magnetic field 122 and determine the angular position of the target 120 based on the magnetic flux density of the reflected magnetic field. In order to permit detection of the angular position of the target 120, the reflected field 122 can have a symmetric gradient with respect to an axis of rotation 124 of the target 120 so that the amplitude of the detected magnetic field varies with rotational angle of the target.

The angle sensor 110 can take the form of an integrated circuit, with the coil 130 and the magnetic field sensing elements 134 supported by a semiconductor die and the axis of rotation 124 can be centered with respect to the sensing elements 134. The target 120 can have an inclined, or beveled surface 128 proximate to the semiconductor die or can otherwise present conductive properties adjacent to the coil that vary with rotational angle. With this configuration, the reflected field 122 can have a symmetric gradient with respect to the axis of rotation 124 of the target 120 and can correspond to conductive properties of the inclined surface of the target.

As described further below, the magnetic field sensing elements 134 can include a first magnetic field sensing structure positioned proximate to the coil 130 and configured to detect the reflected magnetic field 122 generated by the eddy current induced in the target and a second magnetic field sensing structure positioned proximate to the coil and configured to detect the reflected magnetic field generated by the eddy current induced in the target. The first and second magnetic field sensing structures can be configured to detect quadrature components of the reflected magnetic field 122, as will be explained. Suffice it to say here that one of the magnetic field sensing structures detects signals that are in phase with the sine of the reflected field 122 and the other one of the magnetic field sensing structures detects signals that are in phase with the cosine of the reflected field. The processor 138 can determine the angular position of the target 120 by computing an arctangent function (e.g., CORDIC function) based on a ratio of a signal from the second magnetic field sensing structure and a signal from the first magnetic field sensing structure.

Figure 2:
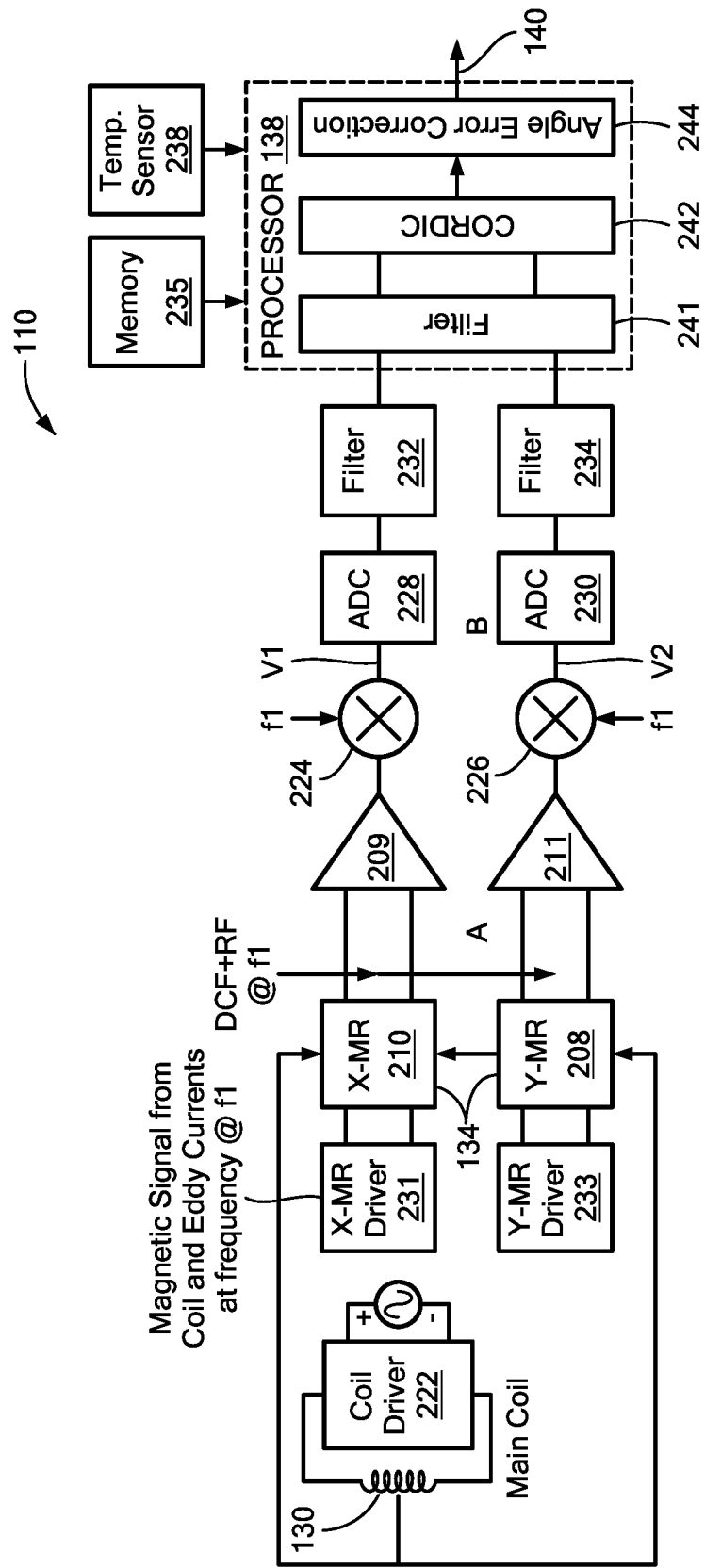
FIG. 2 is a block diagram of an angular position sensor using eddy currents in accordance with aspects of the disclosure.

Referring also to FIG. 2, a block diagram shows further detail of the angle sensor 110, including coil 130 and magnetic field sensing elements 134. Coil 130 can be configured to generate the direct magnetic field 112 when current supplied by a coil driver 222 flows through it. Coil driver 222 can include a power circuit that supplies alternating current (or voltage) to coil 130 to generate the direct magnetic field 112.

Magnetic field sensing elements 134 can include first and second sensing element structures 208, 210, here each in the form of a TMR bridge. Each of bridge 208 and bridge 210 can include a full-bridge circuit that includes a plurality of magnetic field sensing elements. Bridge 208 can be powered by using a driver circuit 231 and bridge 210 can be powered by using a driver circuit 233. Specifically, driver circuit 231 can be configured to supply a driving voltage VTMR1 (or a driving current) (FIG. 4) to the bridge 208, and driver circuit 233 can be configured to provide a driving voltage VTMR2 (FIG. 4) to the bridge 210 (or a driving current). The driving voltage VTMR1 and the driving voltage VTMR2 can be different from one another. Although in the example of FIG. 2 driver circuits 231, 233 are separate elements, it will be appreciated that alternative implementations are possible in which the driver circuits 231, 233 are at least partially integrated.

Bridges 208, 210 are configured to detect quadrature components of the reflected magnetic field 122 (FIG. 1). Achieving sensitivity of one of the bridges 208, 210 to the in-plane field in the x-direction 450 (FIG. 3) and the other one of the bridges to the in-plane field in the y-direction 452 (FIG. 3) can be accomplished in various ways. For example, design of the bridges 208, 210 to detect quadrature field components can be accomplished by implementing the bridges with TMR elements that are repined, as will be explained in connection with FIG. 6. Another way to provide bridges 208, 210 to detect quadrature fields is to use shape anisotropies that result in such sensitivities, as shown and described in connection with FIG. 7.

Stray field immunity is an important consideration in magnetic field sensors and can be achieved in the described sensor 110 based on the reflected magnetic field 122 being differential and being generated at high frequency, whereas, any stray fields are common to all bridge elements and baseband. In other words, the reflected field 122 is naturally decoupled from any stray fields. In general, stray fields refer to magnetic fields detected by the magnetic field sensing elements 134 that are not attributable to the target. Ideally, the effects of such stray fields do not adversely impact target detection by the sensor.

In operation, the bridge 208 can output a differential signal, which is subsequently amplified by an amplifier 209 and demodulated by demodulator 224, at frequency f1 (e.g., the frequency of the coil driver 222, which can be in the MHz range) to produce a signal V1 at DC. Signal V1 can be digitized by analog-to-digital-converter 228 and provided to a filter 232. The output of filter 232 can be provided to the processing circuitry 138. Similarly, bridge 210 can generate a differential signal, which is subsequently amplified by an amplifier 211 and demodulated by demodulator 226, at the frequency f1 to produce a signal V2 at DC. Signal V2 can be digitized by ADC 230 and provided to a filter 234. The output of filter 234 can be provided to the processing circuitry 138.

Processing circuitry 138 can process signals V1 and V2 to generate a sensor output signal 140 which can indicate the angular position of the target 120 relative to the sensor 110. As illustrated, the processing circuitry 138 can implement filtering logic 241, CORDIC logic 242, and angle error correction logic 244. Filtering logic 241 can implement any suitable type of digital filter, such as a low-pass filter, for example. The angular position of the target 120 relative to the sensor 110 can be determined in accordance with CORDIC processing with which the arctangent function of a ratio of signal V1 to V2 is computed. It will be appreciated by those of ordinary skill in the art that functionality of the processor 138 can be performed by one or more programmable processors executing one or more computer programs, by special purpose logic circuitry (e.g., an FPGA (field programmable gate array) and/or an ASIC (application-specific integrated circuit)).

Because the arctangent function is based on a ratio (i.e., of the first magnetic field signal V1 to the second magnetic field signal V2), sensitivity normalization to cancel temperature and lifetime, or sensitivity related drifts is achieved since such factors affect both signals V1, V2 in the same manner. Further, given that normalization is achieved as a result of the angle signal processing, it is not necessary to implement other methodologies for normalization, or offset removal. For example, it is not necessary to use a component of the directly coupled field 112 (FIG. 1) for such purpose as might otherwise be done. As a result, it is desirable to minimize and/or eliminate components of the directly coupled field seen by the sensing elements 134 since otherwise, detection of the directly coupled field 112 by the sensing elements 134, would have to be accounted for (e.g., subtracted out) before angle computation in order to avoid introducing angle error. If there were a residual directly coupled field 112 incident on the sensing elements, then this component could be arithmetically subtracted (e.g., V1–V2) before the angle (e.g., CORDIC) computation.

Various configurations and techniques can be used to minimize the directly coupled field 112 from being detected by the sensing elements 134. For example, use of one or more countercoils or turns of a coil adjacent to the sensing elements can be used, as shown and discussed in connection with FIG. 3.

The angle error correction logic 244 can implement corrections based on temperature variations. To this end, a temperature sensor 238 can provide a temperature signal to the angle error correction logic 244 for use in making the angle signal 140 insensitive to drift based on temperature variations. The corrected angle signal 140 can be output from the sensor 110 for use by other electronic components or devices or systems that are electrically coupled to the sensor 110.

Figure 3:
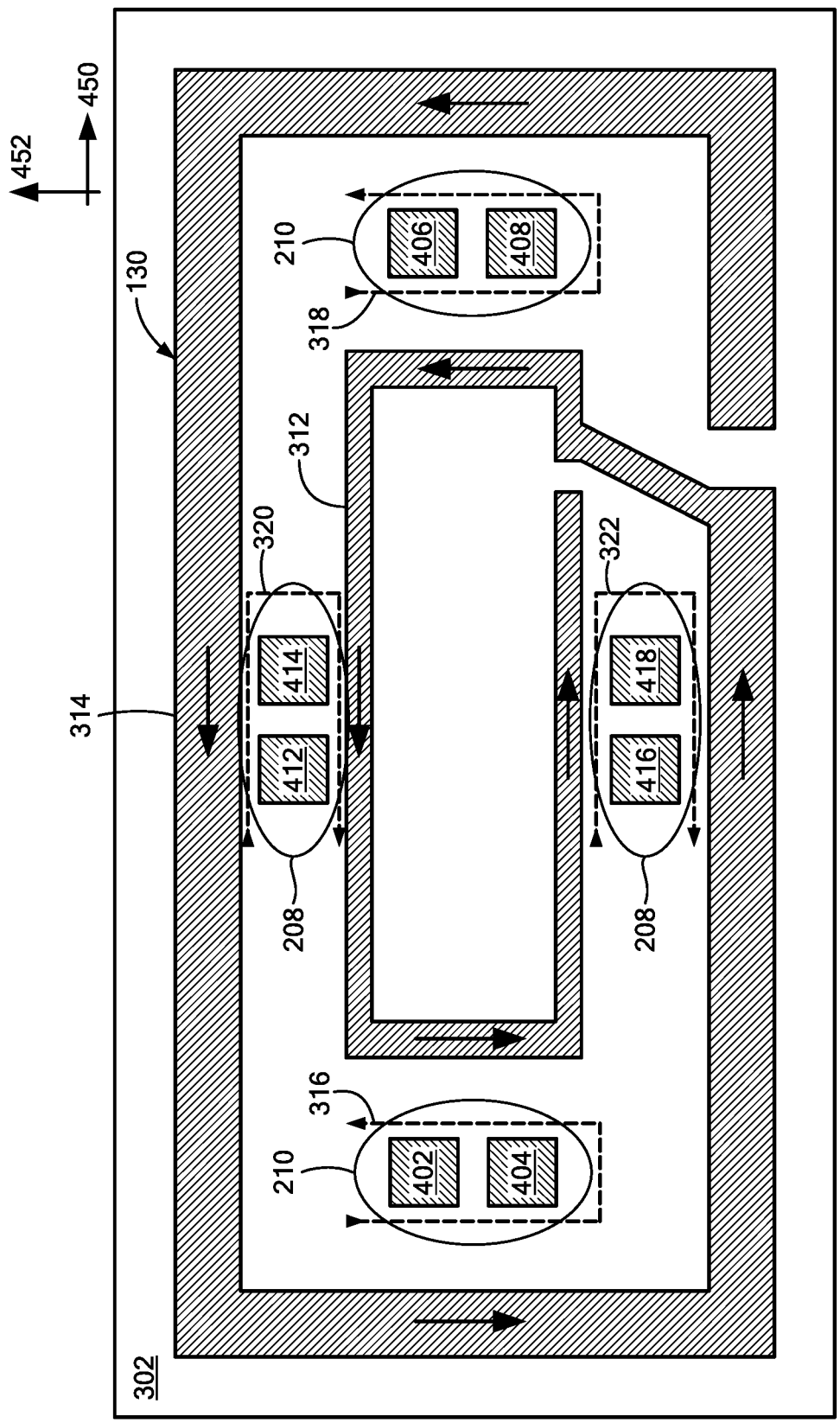
FIG. 3 is a diagram illustrating one implementation of the sensor of FIG. 2, according to aspects of the disclosure.

Referring to FIG. 3, an example physical layout of the coil 130 and magnetic field sensing elements 134 including bridges 208, 210 of FIGS. 1 and 2 is shown. Coil 130 can include a first coil turn 312 and a second coil turn 314. Although arrows on the coils illustrate an example direction of current flow through the coil 130, the current could alternatively flow in the opposite direction. Coil 130 can be implemented as a conductive trace formed on a semiconductor substrate 302 together with bridge 208 including elements 402, 404, 406, and 408 and bridge 210 including elements 412, 414, 416, and 418.

Bridges 208, 210 are positioned within a gap between coil turns 312, 314. Elements of each of the bridges 208, 210 can be formed in regions on opposite sides of the first coil turn 312, as shown, since the reflected field is sensed as a differential field (i.e., differential with respect to rotation axis of the target). For example, elements 402, 404 of bridge 210 can be formed in a region on an opposite side of coil turn 312 as elements 406, 408. Similarly, elements 412, 414 of bridge 208 can be formed in a region on an opposite side of coil turn 312 as elements 416, 418.

Since it is desired that one of the bridges (e.g., bridge 210) be sensitive to the in-plane x-direction field components and the other bridge (e.g., bridge 208) be sensitive to the in-plane y-direction field components, bridges 208, 210 are positioned on the substrate 302 at locations at which such field components occur. For example, given the coil turns 312, 314 and the direction of current flow in the coil 130, x-direction (e.g., direction 450) field components will occur at the locations of bridge elements 402, 404, 406, and 408 and y-direction (e.g., direction 452) field components will occur at the locations of bridge elements 412, 414, 416, and 418.

In order to minimize or eliminate the local directly coupled field at the locations of the sensing elements, "counterturns" or "countercoils" 316, 318, 320, 322 can be positioned proximate to the magnetic field sensing elements, as shown. A countercoil is a coil turn or winding that is designed and/or positioned relative to the sensing elements so that it facilitates achieving a null local field (i.e., field at the position of the sensing elements) that is attributable to the directly coupled field (i.e., the field received directly from the coil 130).

Aspects of the countercoils 316, 318, 320, 322 that can be selected to minimize the local directly coupled field can include trace size, material, position relative to the sensing elements, current flow amount, and/or current flow direction. The direction of current flow through the countercoils 316, 318, 320, 322 can be as illustrated by the arrow heads at the ends of the illustrated countercoil portions. Countercoils 316, 318, 320, 322 can tend to cancel any components of the directly coupled magnetic field 112 incident on the magnetic field sensing elements so that the directly coupled magnetic field 112 incident on the elements is substantially zero. Additional configurations and techniques to minimize or eliminate the local directly coupled field at the locations of the sensing elements can include positioning the elements on top of traces of the coil.

It will be appreciated that although countercoils 316, 318, 320, 322 are shown to be dotted lines and have a different illustrated width than coil turns 312, 314, the countercoils 316, 318, 320, 322 can be the same size as coil turns 312, 314. Furthermore, although countercoils 316, 318, 320, 322 are shown as partial turns without coupling to the remainder of coil 130, the countercoils 316, 318, 320, 322 can be formed as part of the coil.

Figure 3A:
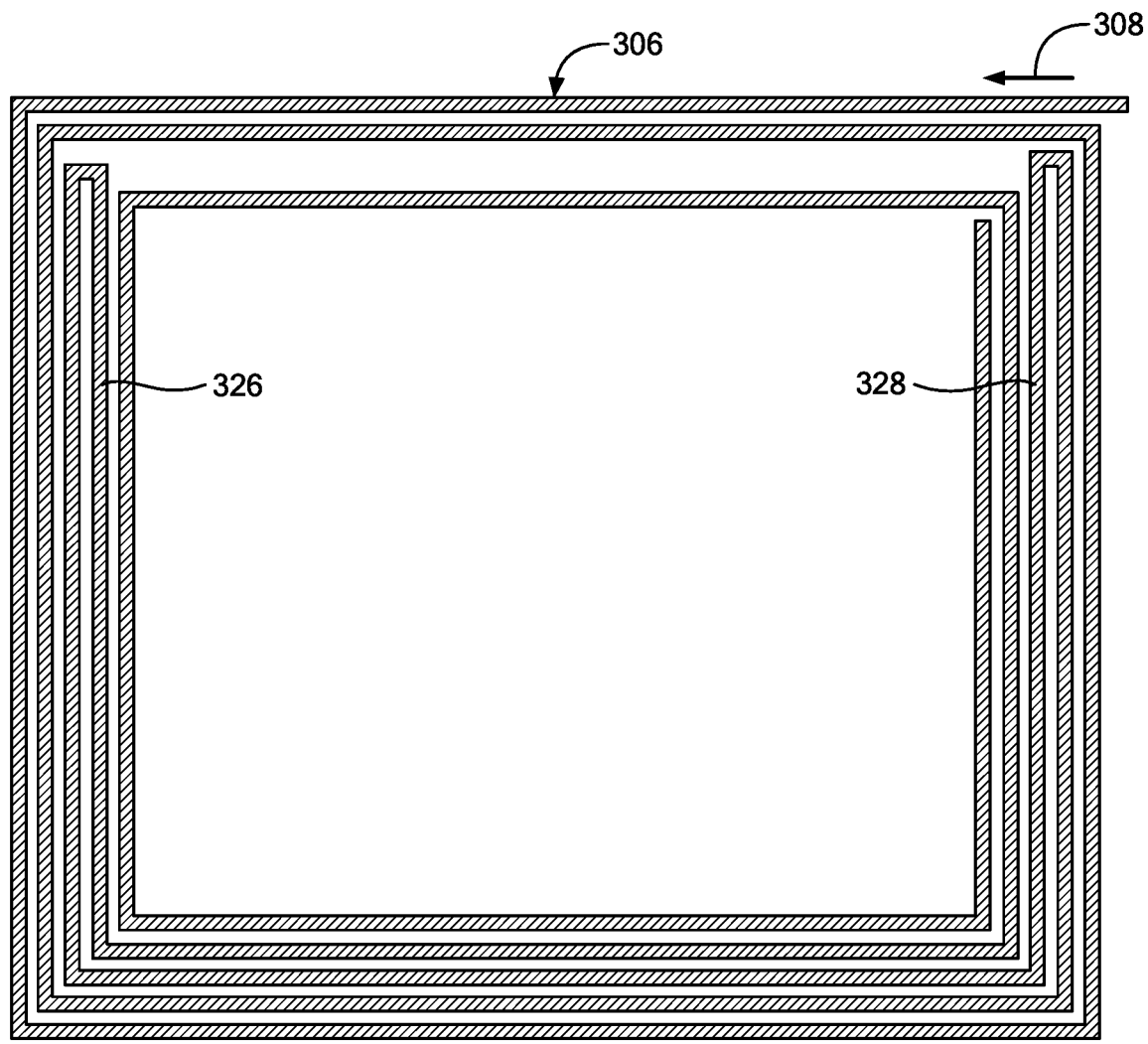
FIG. 3A shows an example countercoil configuration for use in a sensor according to aspects of the disclosure.

One example countercoil configuration is shown in FIG. 3A, in which a coil 306 configured to carry a current 308 includes countercoils 326, 328. Countercoils 326, 328 can be the same as or similar to countercoils 316, 318 of FIG. 3 for example. It will be appreciated that coil 306 can be modified to include additional countercoils as may provide countercoils 320, 322 of FIG. 3.

Sensing elements 402-408 and 412-418 experience the reflected field 122 (FIG. 1) in the same way as each other. In other words, use of countercoils 316, 318 does not impact the ability of the sensing elements 402-408 to detect the reflected field 122. The reflected field 122 can cause the differential output of bridge 208 including elements 412-418 to shift in the same direction as the differential output of bridge 210 including elements 402-408. Thus, the reflected field component can be detected at the differential output of either of the bridges.

Figure 4:
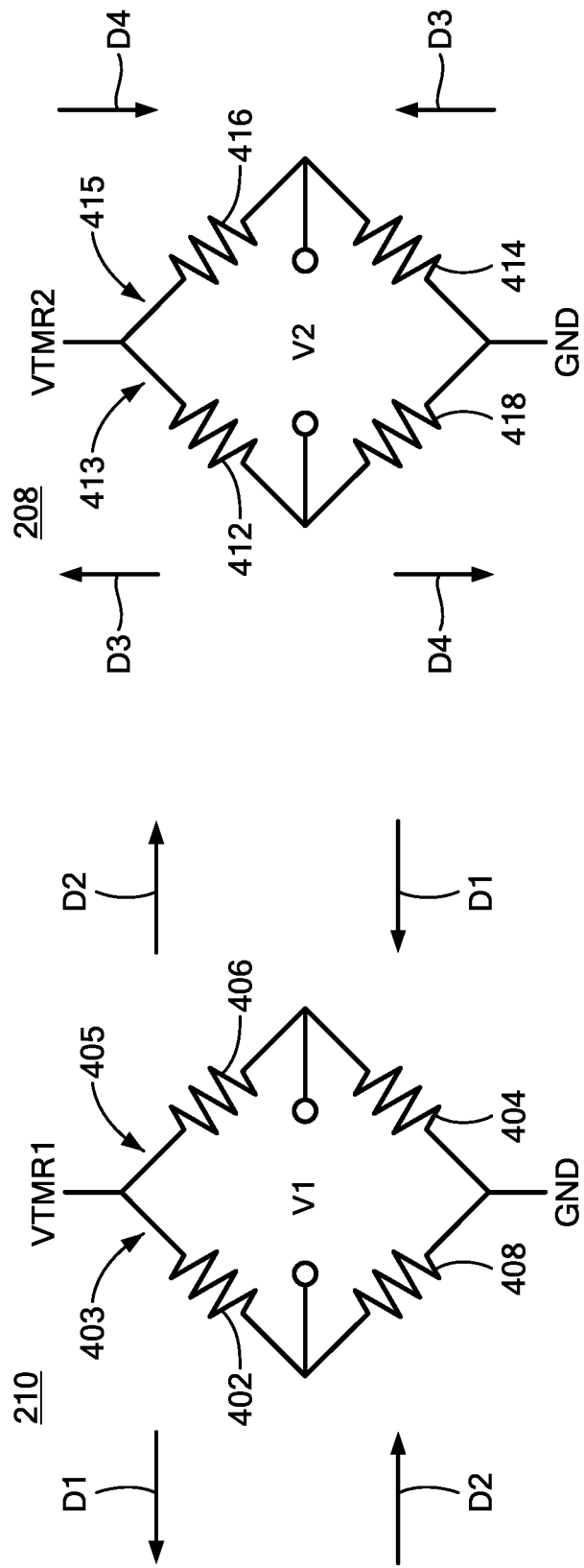
FIG. 4 is a diagram showing example MR bridges of FIG. 3, according to aspects of the disclosure.

Referring also to FIG. 4, an example electrical interconnection of the bridges 208, 210 is shown. Bridge 210 can include a first branch 403 and a second branch 405. The first branch 403 can include MR element 402 and MR element 408 coupled in series between a voltage (or current) source VTMR1 and ground. The second branch 405 can include MR element 406 and MR element 404 coupled in series between the voltage (or current) source VTMR1 and ground.

Similarly, bridge 208 can include a first branch 413 and a second branch 415. The first branch 413 can include MR element 412 and MR element 412 coupled in series between a voltage source VTMR2 (or current) and ground. The second branch 415 can include MR element 416 and MR element 414 coupled in series between the voltage source VMTR2 (or current) and ground.

In embodiments, the MR elements 402-408 and 412-418 can be TMR elements. However, it will be appreciated by those or ordinary skill in the art that in some implementations, any of the elements 402-408 and 412-418 can include one or more of a (Vertical) Hall effect element, a giant magnetoresistance (GMR) element, an anisotropic magnetoresistance (AMR) element, a magnetic tunnel junction (MTJ) element, and/or any other suitable type of element. Any of the MR elements 402-408 can include a single MR element or multiple MR elements.

Coil 130 and the direction of the current flow through the coil turns can result in the reflected magnetic field 122 (FIG. 1) having the in-plane field directions labeled D1, D2, D3, and D4 at each of elements 402-408 and elements 412-418. In particular, at MR elements 402, 404, the reflected magnetic field 122 can have direction D1, at MR elements 406, 408, the reflected magnetic field 122 can have direction D2, at MR elements 412, 414, the reflected magnetic field 122 can have a direction D3, and at MR elements 416, 418, the reflected magnetic field 122 can have a direction D4. According to the present example, directions D1 and D2 are substantially opposite to one another and directions D3 and D4 are substantially opposite to one another.

Consideration of the in-plane field directions D1-D4 of the reflected magnetic field reveals that bridge 208 and bridge 210 are sensitive for quadrature field components (e.g., in the x-direction and y-direction). In particular, bridge 208 is sensitive to field components in the y-direction 452 (FIG. 3) and bridge 210 is sensitive to field components in the x-direction 450 (FIG. 3). With this configuration, each bridge 208, 210 will generate a respective differential voltage signal V1, V2 for processing as shown in FIG. 2, including detection of the angle of rotation of the target.

Figure 5:
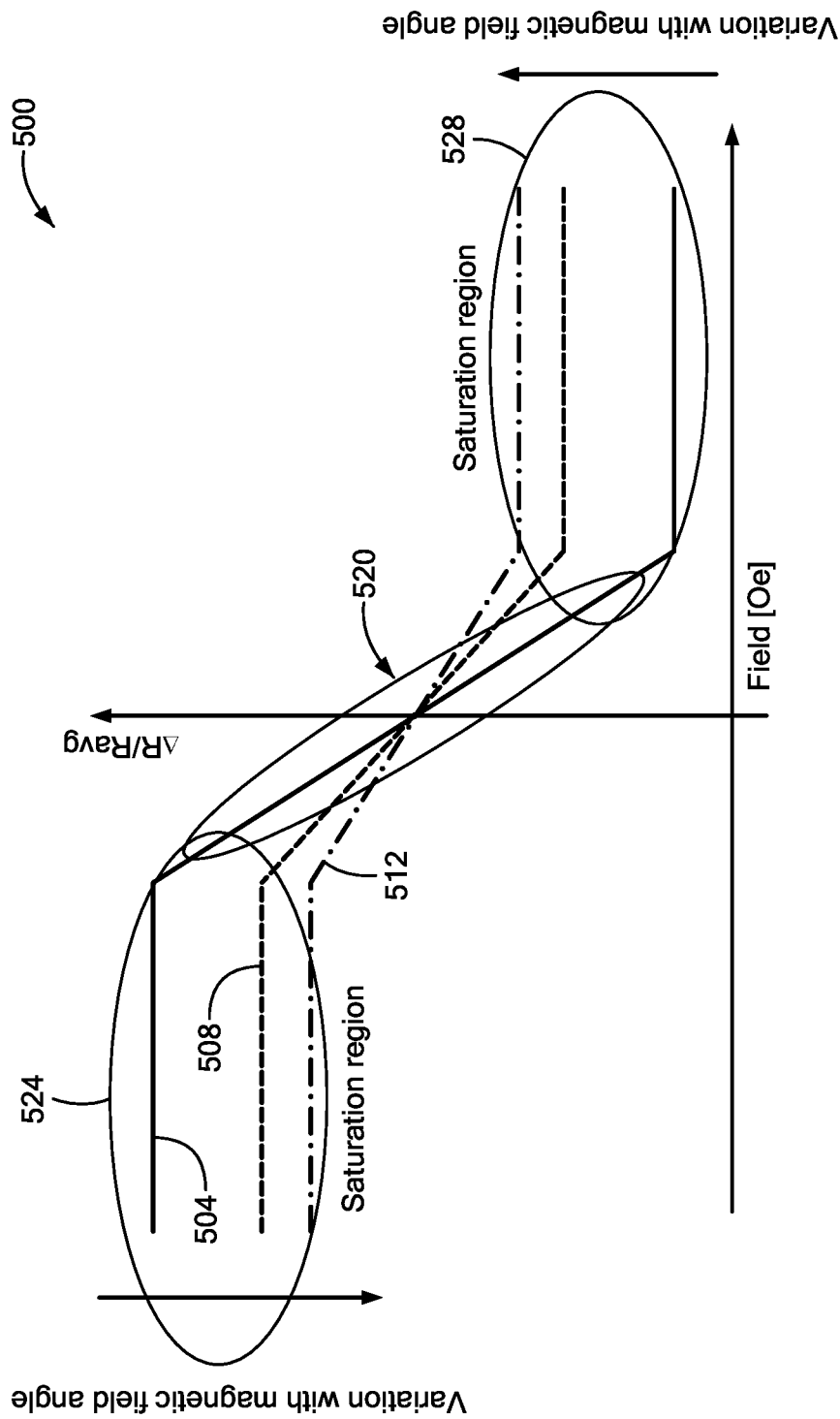
FIG. 5 illustrates response characteristics of example MR elements of FIG. 3, according to aspects of the disclosure.

Referring also to FIG. 5, a transfer function curve 500 illustrates operating regions for sensing elements 134, with a horizontal axis showing magnetic field strength aligned with the TMR element sensitive axis in units of Oersteds and a vertical axis showing normalized resistance variation in units given by $\Delta R/Ravg$. A linear region of operation is denoted 520 and saturations regions are 524, 528. Curves 504, 508, and 512 represent illustrate how sensing element resistance can vary with angle of the detected magnetic field.

As noted above, according to an aspect of the disclosure, elements 134 can include bridges 208, 210, each including respective TMR elements 402, 404, 406, 408 and TMR elements 412, 414, 416, and 418 operating in the linear region 520. Thus, elements of the bridges 208, 210 have a resistance that varies with field strength, as shown. Conventional magnetoresistance-based angle sensors use elements operated in the saturation region 524, 528. This is because the resistance of elements in the saturation region does not vary with field strength and varies only with magnetic field direction (i.e., angle) which is the parameter of interest in an angle sensor. TMR elements operated in the saturation region can be repined to accomplish detection of quadrature field components.

Achieving sensitivity of one of the bridges 208, 210 to the in-plane field in the x-direction 450 (FIG. 3) and the other one of the bridges to the in-plane field in the y-direction 452 (FIG. 3) can be accomplished in various ways. For example, the TMR elements of bridges 208, 210 can be of a type capable of being repined (see FIG. 6) and/or can have different shape anisotropies (see FIG. 7).

Figure 6:
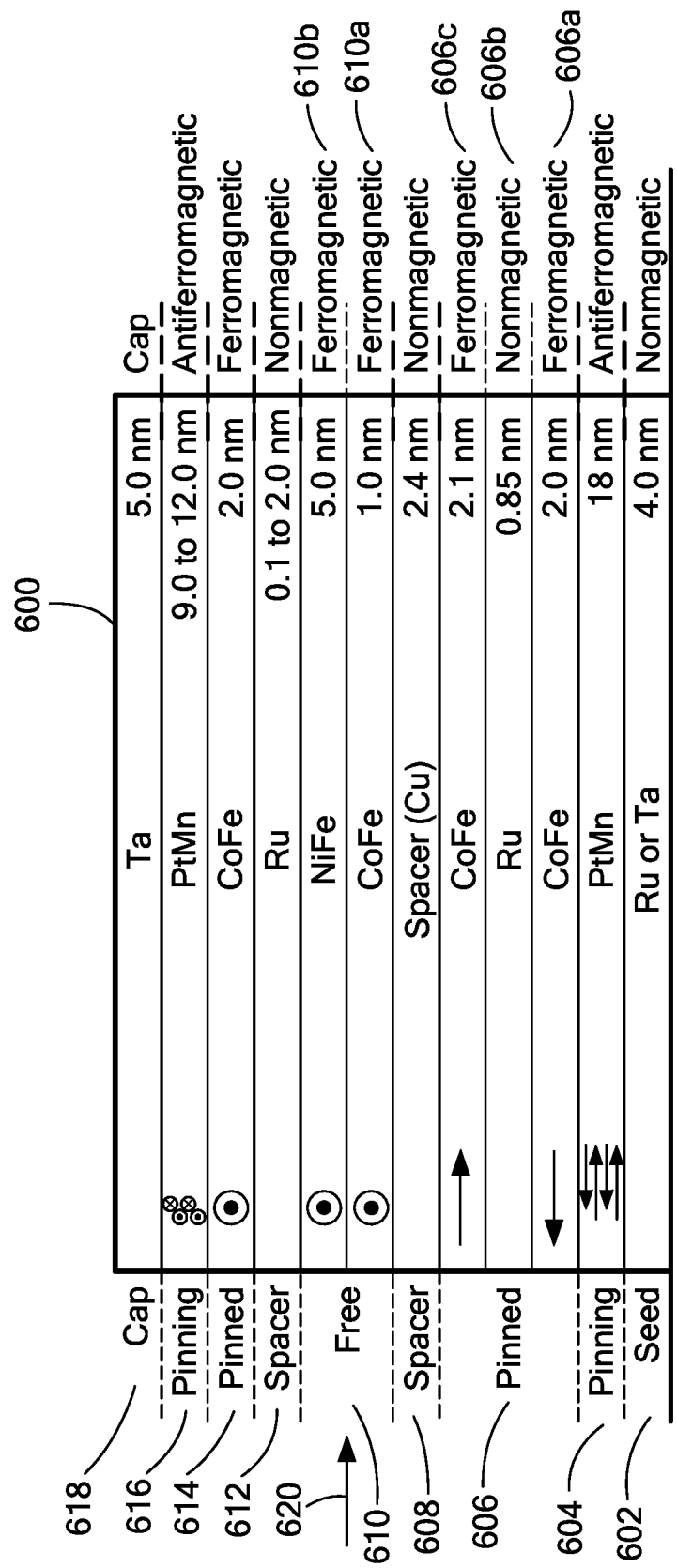
FIG. 6 illustrates an example MR element that can be repined so that it can be used to provide the MR elements of FIG. 3 that have reference and biased free layers that are oriented at ninety degrees with respect to each, according to aspects of the disclosure.

Referring to FIG. 6, an example of a double pinned MR element 600 as may be a TMR element includes a plurality of layers disposed over a substrate. An upper surface of the substrate is shown as a dark line at the bottom of FIG. 6. On the left side of FIG. 6, each layer is identified by functional name. On the right side or FIG. 6 are shown magnetic characteristics of sub-layers that can form the functional layers. Examples of thicknesses of the layers of the TMR element 600 are shown in nanometers. Examples of materials of the layers of the TMR element 600 are shown by atomic symbols. Within some layers, arrows are shown that are indicative or directions of magnetic fields of the layers when the element 600 does not experience an external magnetic field. Arrows coming out of the page are indicated as dots within circles and arrows going into the page are indicated as crosses within circles.

Element 600 can include a seed layer 602 disposed over the substrate, an antiferromagnetic pinning layer 604 disposed over the seed layer 602, and a pinned layer 606 disposed over the antiferromagnetic pinning layer 604. In some embodiments, the pinned layer 606 can be comprised of a first ferromagnetic pinned layer 606a, a second ferromagnetic pinned layer 606c, and a spacer layer 606b disposed therebetween. In some embodiments, the spacer layer 606b is comprised of a nonmagnetic material. In some other embodiments, the pinned layer 606 can instead be comprised of one pinned layer.

Element 600 can also include a spacer layer 608 disposed over the second ferromagnetic pinned layer 606c, and a free layer 610 disposed over the spacer layer 608. In some embodiments, the free layer 610 can be comprised of a first ferromagnetic free layer 610a disposed under a second ferromagnetic free layer 610b. In some embodiments, the spacer layer 608 is comprised of a nonmagnetic material (e.g., an insulating material). For example, the spacer layer 608 can be an insulating nonmagnetic layer (e.g., Al2O3 or MgO).

Element 600 can further include a spacer layer 612 disposed over the second ferromagnetic free layer 610b, and a second pinned layer 614 disposed over the spacer layer 612. In some embodiments, the second pinned layer 614 can be comprised of a ferromagnetic material. In some embodiments, the spacer layer 612 is comprised of a nonmagnetic material (e.g., Ru). Element can further include a second antiferromagnetic pinning layer 616 disposed over the second pinned layer 614. A cap layer 618 can be disposed at the top of the element 600 to protect the element.

In some embodiments, the seed layer 602 is comprised of Ru or Ta, and the first antiferromagnetic pinning layer 604 is comprised of PtMn. In some embodiments, the first pinned layer 606 is comprised of the first ferromagnetic pinned layer 606a comprised of CoFe, the spacer layer 606b comprised of Ru, and the second ferromagnetic pinned layer 606c comprised of CoFe. In some embodiments, the spacer layer 608 is comprised of Cu (or alternatively, Au, or Ag). In some embodiments, the first ferromagnetic free layer 610a is comprised of CoFe and the second ferromagnetic free layer 610b is comprised of NiFe. In some embodiments, the spacer layer 612 is comprised of Ru (or alternatively, Au, or Ag), the second pinned layer 614 is comprised of CoFe, the second antiferromagnetic pinning layer 616 is comprised of PtMn, and the cap layer 618 is comprised of Ta. However, other materials are also possible. The spacer layer 612 being comprised of Ru (or Au, or Ag) allows realizable ranges of thicknesses of the spacer layer 612 to allow for partial pinning of the free layer 620.

While the layers of the element 600 are shown in a particular order, it should be understood that, in other embodiments, the layers 604, 606, and 608 can be exchanged with the layers 616, 614, 612, respectively. In some embodiments, all of the layers shown in FIG. 6 can be reversed in order from bottom to top.

Element 600 has the bias layer pinned at 90 degrees with respect to the reference layer (as is apparent from the two different pinning layer orientations shown in FIG. 6). As will be appreciated by those of ordinary skill in the art, pinning can take place as part of the wafer probing step, in which local heating is achieved by laser or current flowing. The magnetization can be provided by external rotating magnets or coils.

Element 600 can be repined so that the structure can be used to fabricate elements of bridges 208, 210 so that elements of one of the bridges are sensitive to the in-plane field in the x-direction 450 (FIG. 3) and the other one of the bridges are sensitive to the in-plane field in the y-direction 452 (FIG. 3). With this arrangement, elements of the first bridge can have a first reference layer and a first biased free layer and elements of the second bridge can have a second reference layer and a second biased free layer, wherein each of the second reference layer and the second biased free layer is oriented at ninety degrees with respect to the first reference layer and the first biased free layer. In other words, between X and Y, both reference layers are 90 degrees relative to each other, and simultaneously both bias layers also 90 degrees relative to each other. Repinning involves heating to break the magnetic ordering of the material and magnetization to print the new desired magnetic order (pinning direction).

Additional details of element 600 are described in a U.S. Pat. No. 9,529,060, entitled Magnetoresistance Element with Improved Response to Magnetic Fields, that issued on Dec. 27, 2016 and that is incorporated herein by reference in its entirety.

Figure 7:
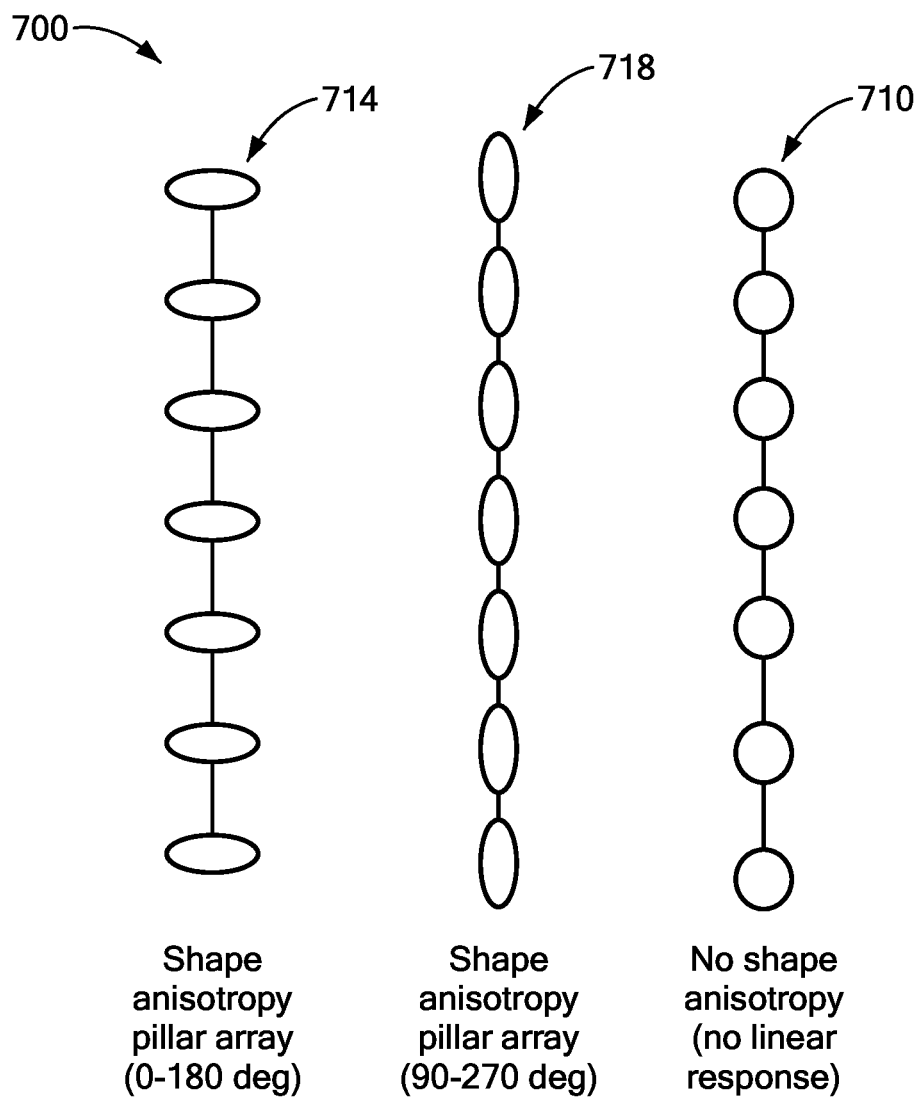
FIG. 7 illustrates example MR element shape anisotropies that can be used to provide the MR elements of FIG. 3, according to aspects of the disclosure.

Referring to FIG. 7, a diagram 700 illustrates various shapes of pillars 714, 718 as may comprise the elements of bridges 208, 210 in order to provide one of the bridges 208, 210 sensitive to the in-plane field in the x-direction 450 (FIG. 3) and the other one of the bridges sensitive to the in-plane field in the y-direction 452 (FIG. 3). In particular, elements of one of the bridges 208, 210 can have a first shape anisotropy (as may be achieved by designing such elements with a first pillar shape 714) and elements of the other one of the bridges can have a second shape anisotropy that is different than the first shape anisotropy (as may be achieved by designing such elements with a second pillar shape 718 that is different than the first pillar shape). With this arrangement, the TMR element pillars of bridge 208 can have the shape labeled 718 that results in a maximum response axis between 0-180 degrees and the TMR element pillars of bridge 210 can have the shape labeled 718 that results in a maximum response axis between 90-270 degrees. Shape anisotropy requires making one dimension of the pillar much smaller than the other one. In such cases the free layer material will tend to generate a natural orientation of its magnetization (i.e., a natural bias field), without requiring repining. Such natural bias field will be oriented with the longest dimension of the pillar. By properly selecting the longest dimension of the pillars for x and y bridges, the bias field directions can be properly arranged. This accounts for bias fields on the free layer. As used herein, the term "anisotropy" or "anisotropic" refer to a material that has different properties according to direction in the material. A magnetoresistance element can have a particular axis or direction to which the magnetization of a ferromagnetic or ferrimagnetic layer tends to orientate when it does not experience an additional, external, magnetic field. An axial anisotropy can be created by a crystalline effect or by a shape anisotropy, both of which can allow two equivalent directions of magnetic fields. Pillar shape 710 illustrates a shape that does not result in a linear response since rounded pillars (i.e., no shape anisotropy) have such a steep transition that it cannot be used as a linear transducer provided its almost zero linear range. The biasing (or soft pinning) of the free layer (either by repining or by means of shape anisotropy) is what reduces and controls this slope.

It will be appreciated that even with the use of different shape anisotropies for the elements of the bridges 208, 210, repining of the reference layer of these elements is required so that x and y are orthogonal to each other. In other words, while repining of a stack 600 (FIG. 6) to provide elements of bridges 208, 210 requires repinning of both the reference layer and the free layer (bias), use of different shape anisotropies as illustrated by FIG. 7 requires repining of only the reference layer since the free layer biasing is naturally generated along the longest dimension.

Other strategies for achieving different shape anisotropies of the elements in the bridges 208, 210 can be used to provide one of the bridges 208, 210 to the in-plane field in the x-direction 450 (FIG. 3) and the other one of the bridges to the in-plane field in the y-direction 452 (FIG. 3). For example, in addition to or as an alternative to the first bridge 208 and the second bridge 210 differing from each other in pillar shape, elements of the bridges can have different widths, thicknesses or shapes, including different aspect ratios of the sensing layer for example.

Figure 8A:
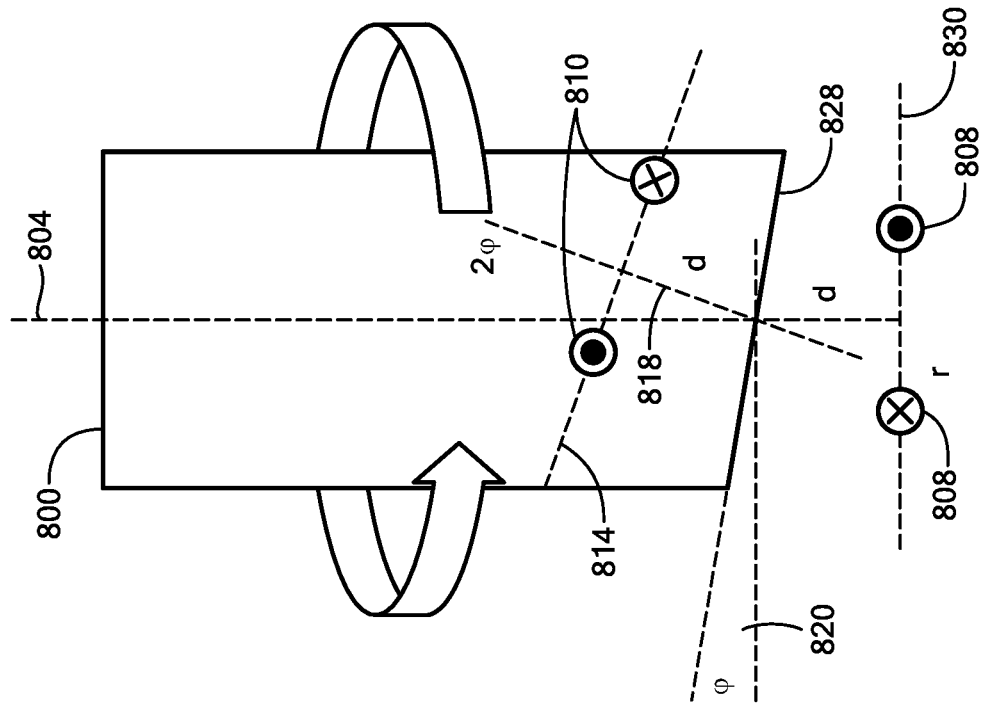
FIGS. 8A and 8B illustrate position and rotation of an example target relative to the sensor, according to aspects of the disclosure.
Figure 8B:
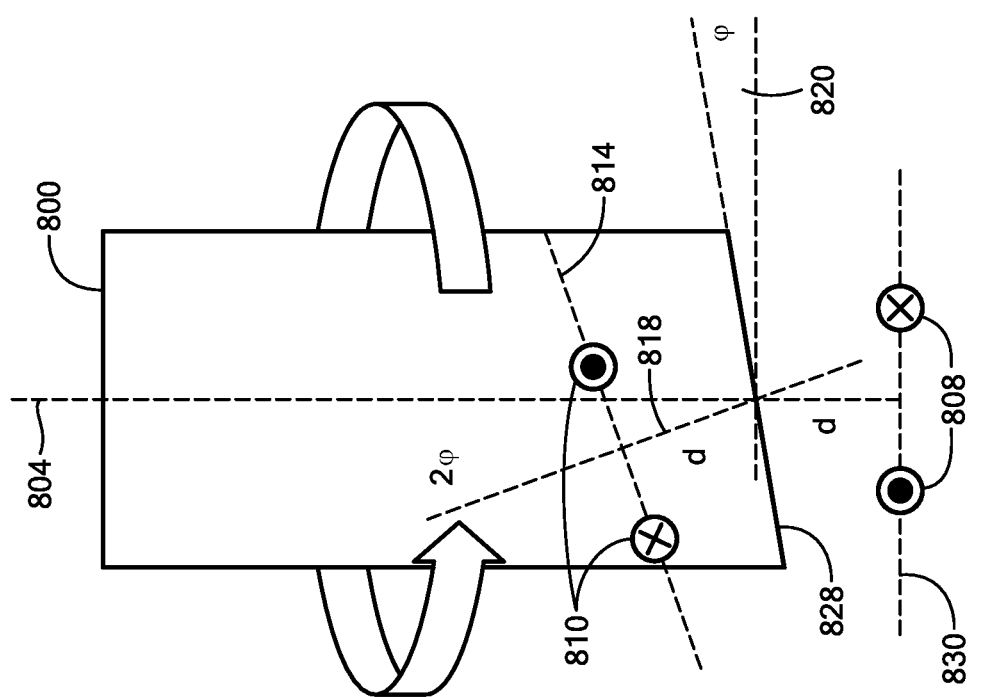

Referring to FIGS. 8A and 8B, an example target 800, as may be the same as or similar to target 120 of FIG. 1, is shown in the form of a cylinder having an end 828 that is beveled, or inclined at an angle φ 820. Target 800 rotates about an axis of rotation 804, with FIG. 8A showing a first angular position of the target and FIG. 8B showing a second angular position of the target at approximately 180 degrees with respect to the position of FIG. 8A.

A coil 808, as may be the same as or similar to coil 130 of FIG. 1, can be formed on a plane 830 (e.g., a surface of a semiconductor substrate) and radiates a magnetic field toward the end 828 of the target. In these cross-sectional views, it is understood that an X in a circle indicates a current into the paper and a dot in a circle indicates a current coming out of the paper.

The inclined end 828 of the target 800 can be at least partially conductive. In some embodiments, at least the end 828 of the target 800 is formed from a conductive material, such as aluminum. For example, in some embodiments, a conductive material can be applied to the end 828 of the cylindrical target and the target can be formed from a conductive or non-conductive material. An example range for the angle φ of target end 828 is about +/−45 degrees. In some embodiments, the angle φ is between about 5 and 15 degrees.

A "mirrored coil" 810 is shown at a distance from the end 828 of the target 800 at a given location. It is understood that the mirrored coil is an idealized model, which assumes a perfect conductor and vacuum, that can be used to model the reflected field (e.g., reflected field 122 of FIG. 1) from the conductive target end 828. In other words, in accordance with Maxwell's equations, the magnetic field from the coil 808 induces Eddy currents in the conductive surface 828 of the target 800 and the Eddy currents result in the modeled mirrored coil 810.

The end 828 of the target 800, at the axis 804 of the target, is located a distance d from the plane 824 of the coil 808. The mirrored coil 810 is located in a plane 814 that is bisected by a segment 818 extending perpendicularly from the mirrored coil plane 814 such that an angle formed by segment 818 and the target longitudinal axis 804 is 2φ. The segment 818 extends a distance d from the end 828 of the target at the axis 804 to the plane 814 of the mirrored coil 810.

As noted above, the coil 808 causes eddy current to flow in the target that, in turn, causes a reflected field to emanate from the target 800. The reflected field can be modeled as the mirrored coil 810. Magnetic field sensing elements 134 (FIG. 1) can detect the reflected field and generate an angular position signal for the target 800.

Figure 9A:
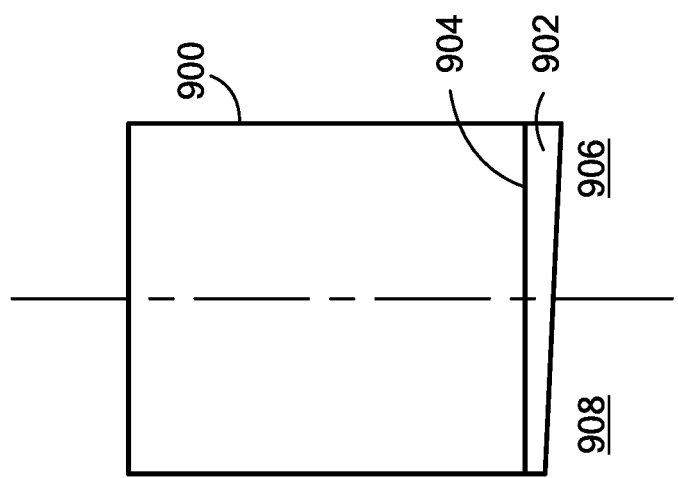
FIG. 9A is a schematic representation of a target having an end surface with non-uniform layer of conductive material.
Figure 9B:
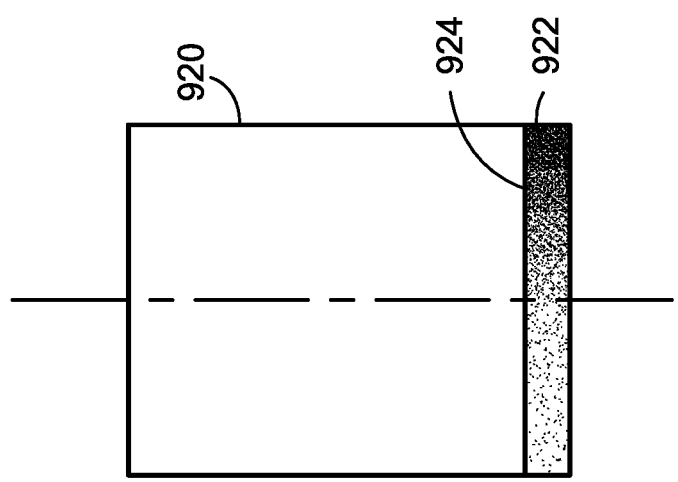
FIG. 9B is a schematic representation of a target having an end surface with uniform layer of conductive material having a conductivity gradient.
Figure 9C:
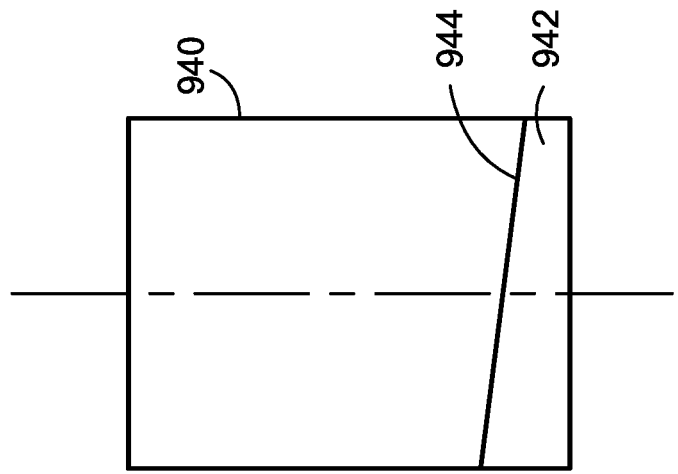
FIG. 9C is a schematic representation of a target having a cut end surface with a layer of conductive material that may form a surface that can be parallel to a sensor.

Referring also to FIGS. 9A, 9B, 9C, alternative targets 900, 920, 940, respectively are shown. Each of targets 900, 920, 940 is an alternative to having an inclined target surface proximate to the sensing elements. Rather, in targets 900, 920, 940 have a non-inclined, or flat end surface and a non-uniform layer of conductive material that causes the reflected field to have similarity to the target 120 with an inclined end, which reflected field has a symmetric gradient with respect to the axis of rotation of the target.

FIG. 9A shows an example target 900 with a layer of conductive material 902 on an end surface 904 of the target. In one embodiment, the target 900 comprises a cylinder with 90 degree cuts at each end. The conductive material 902 is applied to the end surface 904 such that one side 906 of the end surface has conductive material 902 with a first thickness and the other side 908 of the end surface 904 has conductive material 902 with a second thickness that is less than the first thickness. The varying thickness of the conductive material 902 provides a conductivity gradient across the end surface 904 of the target. The varying thickness of the conductive material 902 may create a reflected field that has a gradient that is symmetric with respect to the axis of rotation.

FIG. 9B shows an example target 920 with a layer of conductive material 922 on an end surface 924 of the target. In one embodiment, the target 920 comprises a cylinder with 920 cuts at each end. The conductive material 922 is applied to the end surface 924 with a substantially uniform thickness. The conductive material 922 has properties that create a conductivity gradient across the end surface 924 of the target. In an example embodiment, first and second materials are mixed in varying proportions to create the conductive material 922 of uniform thickness and varying conductivity. The varying conductivity of the conductive material 922 may create a reflected field that has a symmetric gradient with respect to the axis of rotation.

FIG. 9C shows an example target 940 with a layer of conductive material 942 on a cut, or inclined end surface 944 of the target 940. The conductive material 942 is applied to the end surface 944 with a thickness to form a parallel surface proximate to a sensor.

Having described exemplary embodiments, it will now become apparent to one of ordinary skill in the art that other embodiments incorporating their concepts can also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein can be combined to form other embodiments not specifically set forth above. Various elements, which are described in the context of a single embodiment, can also be provided separately or in any suitable subcombination. Other embodiments not specifically described herein are also within the scope of the following claims.

What is claimed is:

1. A magnetic field angle sensor, comprising:
    a coil configured to generate a magnetic field that induces an eddy current in a rotatable target;

a first magnetic field sensing structure comprising at least one first magnetoresistance element positioned proximate to the coil and configured to detect a reflected magnetic field generated by the eddy current induced in the rotatable target, wherein the reflected magnetic field comprises quadrature components;

a second magnetic field sensing structure comprising at least one second magnetoresistance element positioned proximate to the coil and configured to detect the reflected magnetic field generated by the eddy current induced in the rotatable target, wherein the first and second magnetic field sensing structures are configured to detect the quadrature components of the reflected magnetic field; and a processing module configured to process the reflected magnetic field detected by the first and second magnetic field sensing structures for determining an angular position of the rotatable target.

2. The magnetic field angle sensor of claim 1, wherein an axis of rotation of the rotatable target is centered with respect to the coil.

3. The magnetic field angle sensor of claim 2, wherein the coil, the first magnetic field sensing structure, and the second magnetic field sensing structure are supported by a semiconductor die and wherein the rotatable target has an inclined surface proximate to the semiconductor die.

4. The magnetic field angle sensor of claim 3, wherein the reflected magnetic field has a gradient that is symmetric with respect to the axis of rotation of the rotatable target and corresponds to conductive properties of the inclined surface of the rotatable target.

5. The magnetic field angle sensor of claim 1, wherein each of the first magnetic field sensing structure and the second magnetic field sensing structure comprises one or more TMR elements operated in a linear region.

6. The magnetic field angle sensor of claim 5, wherein the first magnetic field sensing structure comprises at least one first TMR element having a first reference layer and wherein the second magnetic field sensing structure comprises at least one second TMR element having a second reference layer, wherein the second reference layer is oriented at ninety degrees with respect to the first reference layer.

7. The magnetic field angle sensor of claim 5, wherein the first magnetic field sensing structure has a first shape anisotropy configured to provide the first magnetic field sensing structure with a first maximum response axis and wherein the second magnetic field sensing structure has a second shape anisotropy configured to provide the second magnetic field sensing structure with a second maximum response axis that is orthogonal with respect to the first maximum response axis, wherein the first shape anisotropy is different than the second shape anisotropy.

8. The magnetic field angle sensor of claim 1, wherein each of the first and second magnetic field sensing structures comprises a plurality of magnetic field sensing elements electrically coupled in a bridge configuration.

9. The magnetic field angle sensor of claim 1, wherein the processing module is further configured to compute the angular position of the rotatable target based on a ratio of a signal from the second magnetic field sensing structure and a signal from the first magnetic field sensing structure.

10. The magnetic field angle sensor of claim 9, wherein the processing module is configured to compute an arctangent function based on a ratio of a signal from the second magnetic field sensing structure and a signal from the first magnetic field sensing structure.

11. The magnetic field angle sensor of claim 1, wherein the coil comprises at least two turns spaced by a gap and wherein the first and second magnetic field sensing structures are positioned in the gap.

12. The magnetic field angle sensor of claim 1, wherein the coil, the first magnetic field sensing structure, and the second magnetic field sensing structure are configured such that a directly coupled magnetic field generated by the coil and experienced by the first and second magnetic field sensing structures tends to cancel.

13. A method comprising:

generating a magnetic field with a coil, wherein the magnetic field induces an eddy current in a rotatable target;

detecting a reflected magnetic field generated by the eddy current induced in the rotatable target with first and second magnetic field sensing structures each comprising at least one magnetoresistance element, wherein the reflected magnetic field comprises quadrature components, and the first and second magnetic field sensing structures are configured to detect the quadrature components of the reflected magnetic field; and processing the reflected magnetic field detected with the first and second magnetic field sensing structures to determine an angular position of the rotatable target.

14. The method of claim 13, wherein detecting the reflected magnetic field comprises detecting a reflected magnetic field that has a gradient that is symmetric with respect to an axis of rotation of the rotatable target and that corresponds to conductive properties of an inclined surface of the rotatable target.

15. The method of claim 13, wherein detecting the reflected magnetic field with first and second magnetic field sensing structures that are configured to detect quadrature components of the reflected magnetic field comprises detecting the reflected magnetic field with one or more TMR elements operated in a linear region.

16. The method of claim 13, wherein processing the reflected magnetic field comprises computing the angular position of the rotatable target based on a ratio of a signal from the second magnetic field sensing structure and a signal from the first magnetic field sensing structure.

17. The method of claim 13, further comprising positioning the coil and the first and second magnetic field sensing structures such that a directly coupled magnetic field generated by the coil and experienced by the first and second magnetic field sensing structures tends to cancel.

18. A magnetic field angle sensor, comprising:

means configured to generate a magnetic field that induces an eddy current in a rotatable target;

first magnetic field sensing means comprising at least one first magnetoresistance element positioned proximate to the magnetic field generating means and configured to detect a reflected magnetic field generated by the eddy current induced in the rotatable target, wherein the reflected magnetic field comprises quadrature components;

second magnetic field sensing means comprising at least one second magnetoresistance element positioned proximate to the magnetic field generating means and configured to detect the reflected magnetic field generated by the eddy current induced in the rotatable target, wherein the first and second magnetic field sensing means are configured to detect the quadrature components of the reflected magnetic field; and processing means configured to process the reflected magnetic field detected by the first and second magnetic field sensing means for determining an angular position of the rotatable target.

19. The magnetic field angle sensor of claim 18, wherein the reflected magnetic field has a gradient that is symmetric with respect to an axis of rotation of the rotatable target and corresponds to conductive properties of an inclined surface of the rotatable target.

20. A magnetic field angle sensor, comprising:
a coil configured to generate a magnetic field that induces an eddy current in a target;
a first magnetic field sensing structure comprising at least one first magnetoresistance element positioned proximate to the coil and configured to detect a reflected magnetic field generated by the eddy current induced in the target;
a second magnetic field sensing structure comprising at least one second magnetoresistance element positioned proximate to the coil and configured to detect the reflected magnetic field generated by the eddy current induced in the target; and
a processing module configured to process the reflected magnetic field detected by the first and second magnetic field sensing structures for determining an angular position of the target,
wherein a reference layer of the at least one first magnetoresistance element is repinned such that the repinned reference layer and a reference layer of the at least one second magnetoresistance element are sensitive to magnetic fields in directions that are oriented at ninety degrees with respect to each other.

21. The magnetic field angle sensor of claim 20, wherein a biased free layer of the at least one first magnetoresistance element is repinned such that the repinned biased free layer and a biased free layer of the at least one second magnetoresistance element are sensitive to magnetic fields in directions that are oriented at ninety degrees with respect to each other.

22. A magnetic field angle sensor, comprising:
a coil configured to generate a magnetic field that induces an eddy current in a target;
a first magnetic field sensing structure comprising at least one first magnetoresistance element positioned proximate to the coil and configured to detect a reflected magnetic field generated by the eddy current induced in the target;
a second magnetic field sensing structure comprising at least one second magnetoresistance element positioned proximate to the coil and configured to detect the reflected magnetic field generated by the eddy current induced in the target; and
a processing module configured to process the reflected magnetic field detected by the first and second magnetic field sensing structures for determining an angular position of the target, wherein the first magnetic field sensing structure has a first shape anisotropy configured to provide the first magnetic field sensing structure with a first maximum response axis and the second magnetic field sensing structure has a second shape anisotropy configured to provide the second magnetic field sensing structure with a second maximum response axis that is orthogonal with respect to the first maximum response axis, wherein the first shape anisotropy is different than the second shape anisotropy.

* * * * *

UNITED STATES PATENT AND TRADEMARK OFFICE
CERTIFICATE OF CORRECTION

| | |
|---|---|
| PATENT NO. | : 11,578,997 B1 |
| APPLICATION NO. | : 17/410394 |
| DATED | : February 14, 2023 |
| INVENTOR(S) | : Hernán D. Romero et al. |

It is certified that error appears in the above-identified patent and that said Letters Patent is hereby corrected as shown below:

In the Specification

Column 1, Line 10 delete "used detect" and replace with --used to detect--.

Column 1, Line 31 delete "repining" and replace with --repinning--.

Column 1, Lines 40-41 delete "positioned comprising" and replace with --comprising--.

Column 3, Line 29 delete "of angle" and replace with --of an angle--.

Column 3, Line 46 delete "each," and replace with --each other,--.

Column 7, Line 56 delete "412 and MR element 412" and replace with --412--.

Column 8, Line 48 delete "repined" and replace with --repinned--.

Column 8, Line 55 delete "repined" and replace with --repinned--.

Column 8, Line 61 delete "by functional" and replace with --by a functional--.

Column 8, Line 62 delete "or FIG. 6" and replace with --of FIG. 6--.

Column 9, Line 1 delete "or directions" and replace with --of directions--.

Column 9, Line 34 delete ". Element can" and replace with --. Element 600 can--.

Column 10, Lines 18-19 delete "layers also" and replace with --layers are also--.

Column 11, Line 1 delete "repining" and replace with --repinning--.

Signed and Sealed this
Thirtieth Day of January, 2024

Katherine Kelly Vidal
*Director of the United States Patent and Trademark Office*

CERTIFICATE OF CORRECTION (continued)
U.S. Pat. No. 11,578,997 B1

Column 11, Line 5 delete "repining" and replace with --repinning--.

Column 11, Line 7 delete "repining" and replace with --repinning--.

Column 11, Line 10 delete "repining" and replace with --repinning--.

Column 11, Line 56 delete "surface 828" and replace with --end 828--.

Column 11, Line 60 delete "plane 824" and replace with --plane 814--.

Column 12, Line 10 delete ", in targets" and replace with --, targets--.

Column 12, Line 33 delete "920 cuts" and replace with --90 degree cuts--.